United States Patent [19]

Inoue et al.

[11] Patent Number: 5,673,103
[45] Date of Patent: Sep. 30, 1997

[54] EXPOSURE APPARATUS AND METHOD

[75] Inventors: Soichi Inoue, Yokohama; Satoshi Tanaka, Kawasaki; Tadahito Fujisawa, Tokyo, all of Japan

[73] Assignee: Kabushiki Kaisha Toshiba, Kawasaki, Japan

[21] Appl. No.: 703,530

[22] Filed: Aug. 23, 1996

Related U.S. Application Data

[63] Continuation of Ser. No. 311,342, Sep. 23, 1994, abandoned.

[30] Foreign Application Priority Data

Sep. 24, 1993 [JP] Japan ................................. 5-238147
Dec. 28, 1993 [JP] Japan ................................. 5-354150

[51] Int. Cl.⁶ ............................................. G02B 21/14
[52] U.S. Cl. ............................ 355/71; 355/53; 359/122; 359/352; 359/386; 359/483
[58] Field of Search .......................... 355/53, 71; 359/122, 359/386, 352, 483, 489, 484, 501

[56] References Cited

U.S. PATENT DOCUMENTS 4,634,240  1/1987  Suzuki et al. ............................ 350/508
5,420,717  5/1995  Tabata ..................................... 359/371

FOREIGN PATENT DOCUMENTS 4-101148   4/1992  Japan .
4-366841  12/1992  Japan .
5-109601   4/1993  Japan .

Primary Examiner—Daniel P. Malley
Attorney, Agent, or Firm—Oblon, Spivak, McClelland, Maier & Neustadt, P.C.

[57] ABSTRACT

An exposure apparatus for reducing/projecting a plurality of patterns of a photomask, which are elongated in at least two different directions, onto a substrate through the photomask includes a polarized light source for illuminating the photomask, a polarization control unit for changing the direction of polarization of polarized light from the polarized light source, a slit filter arranged at a position where the polarized light is focused and having a slit-like opening portion elongated in a direction perpendicular to the direction of polarization of the polarized light, the slit filter transmitting polarized light, of the polarized light passing through the photomask, which has the direction of polarization, a unit for changing the direction of the opening portion of the slit filter in synchronism with a change in direction of polarization of polarized light which is made by the polarization control unit, and a unit for illuminating the photomask with the polarized light at each position where the direction of the pattern becomes parallel to the direction of polarization of the polarized light, thereby exposing a pattern, formed on the photomask, onto the substrate at the angle of a direction of polarization perpendicular to an incident plane of light incident on the substrate.

27 Claims, 16 Drawing Sheets

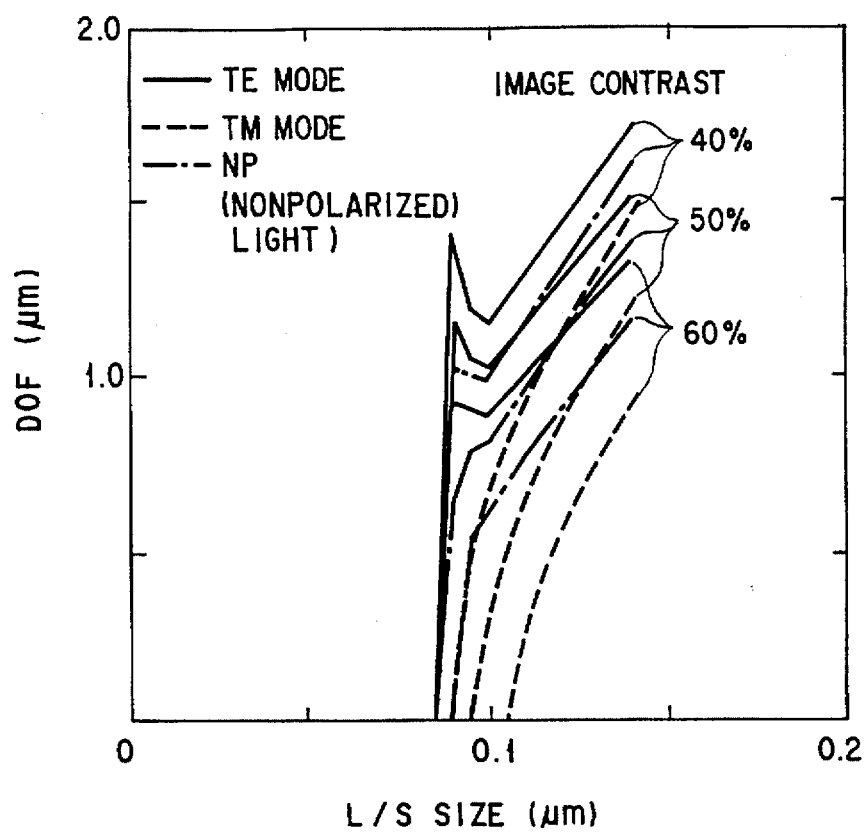
FIG. 6
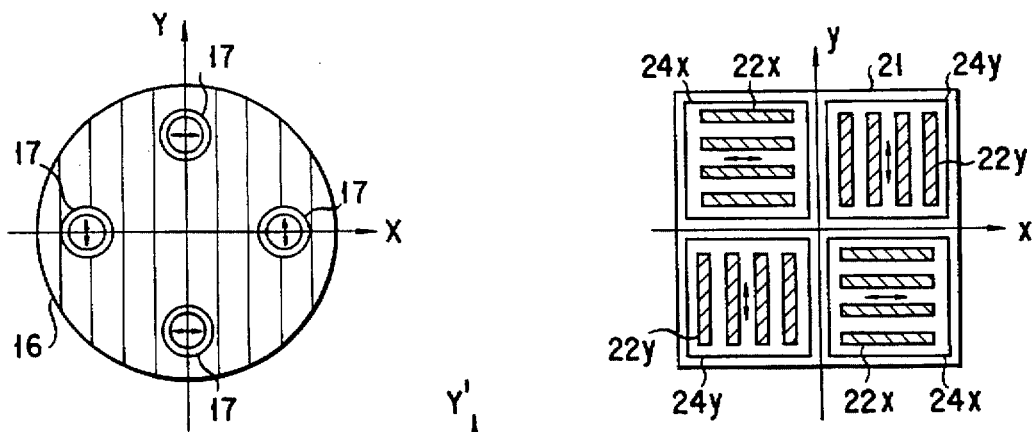
FIG. 9A    FIG. 9B
FIG. 9C

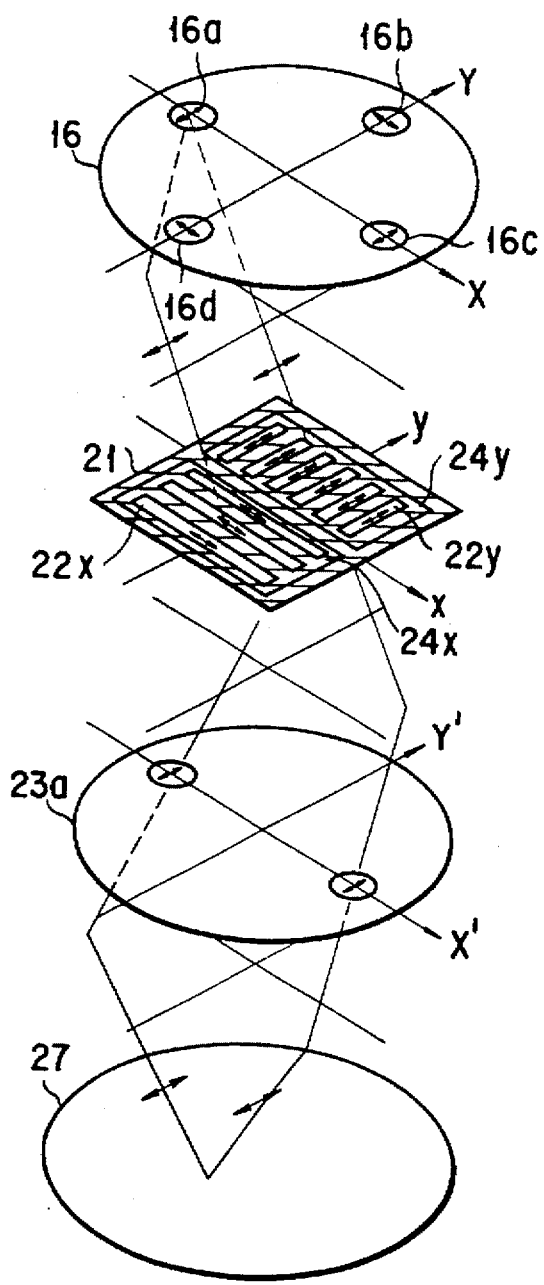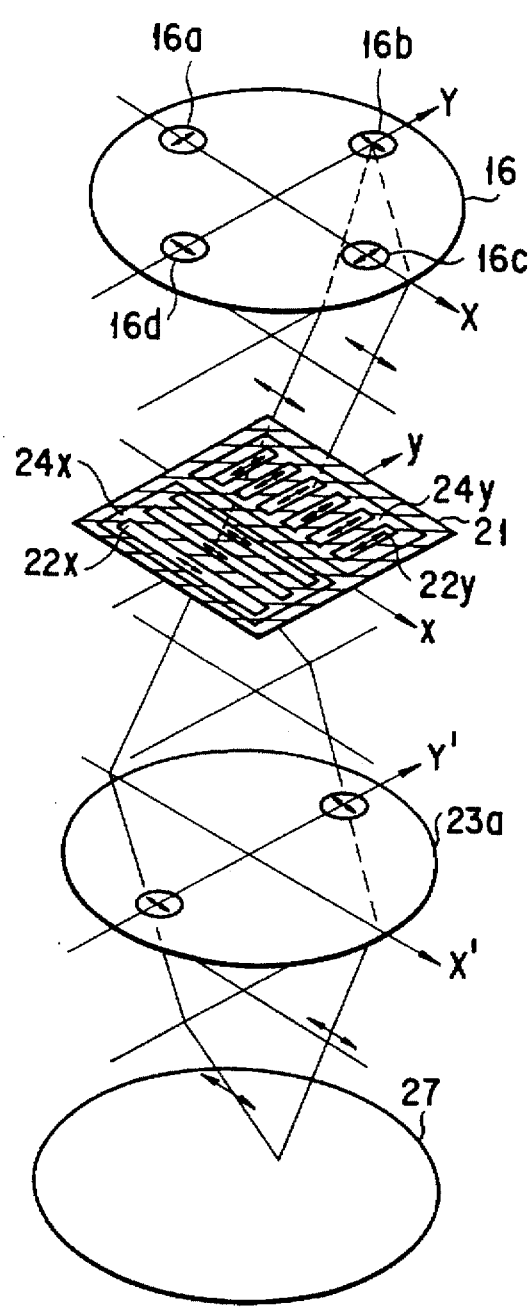
F I G. 10A        F I G. 10B

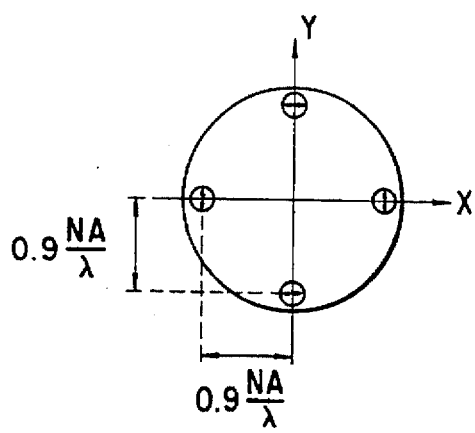
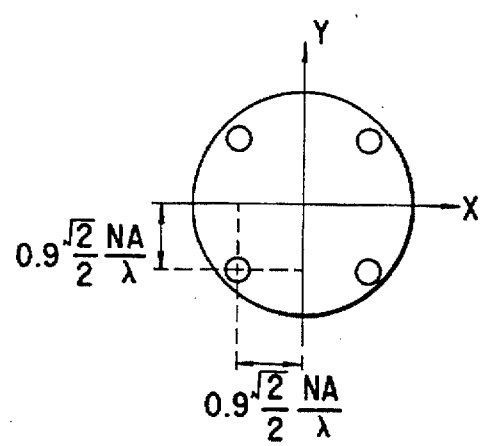
FIG. 11A  FIG. 11B
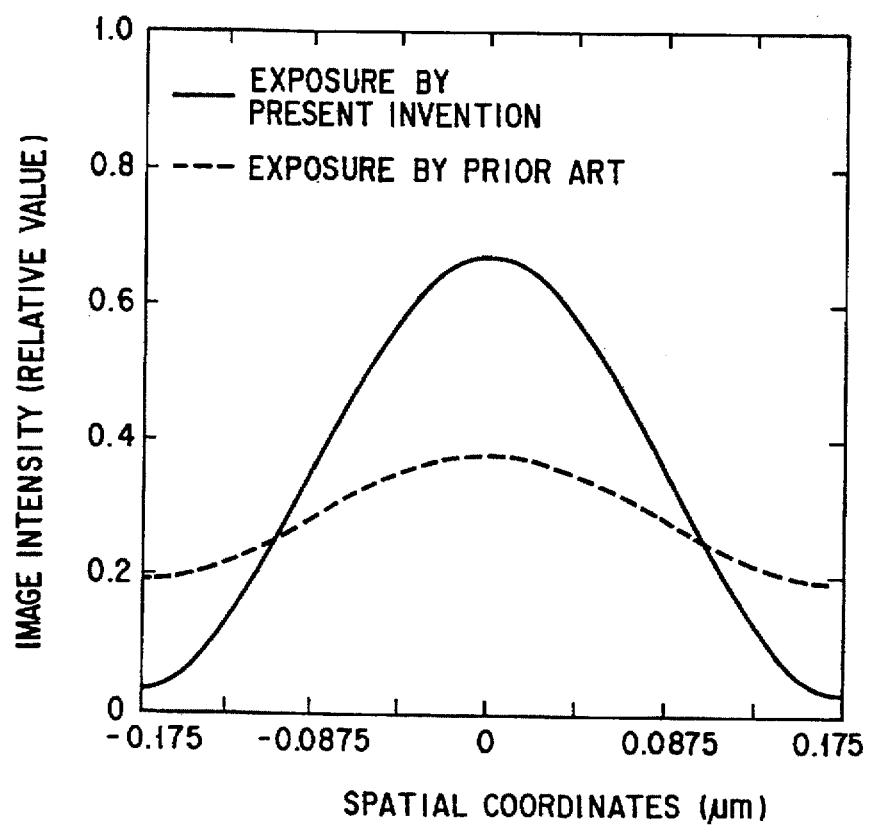
FIG. 12

F I G. 13A 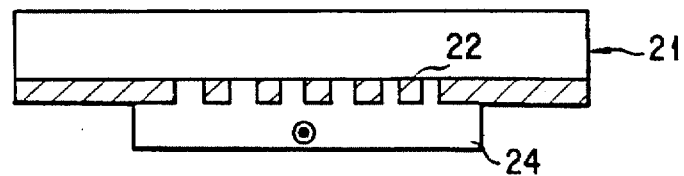
F I G. 13B 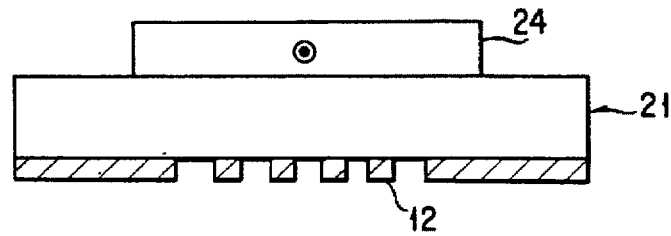
F I G. 13C 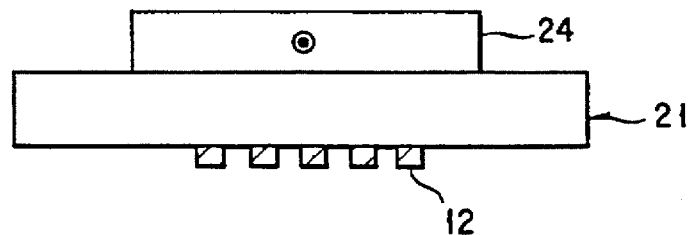
F I G. 13D 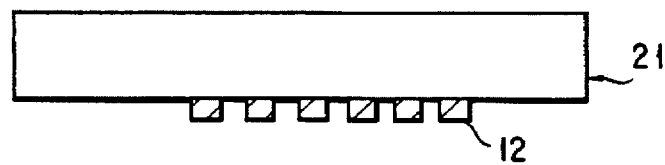

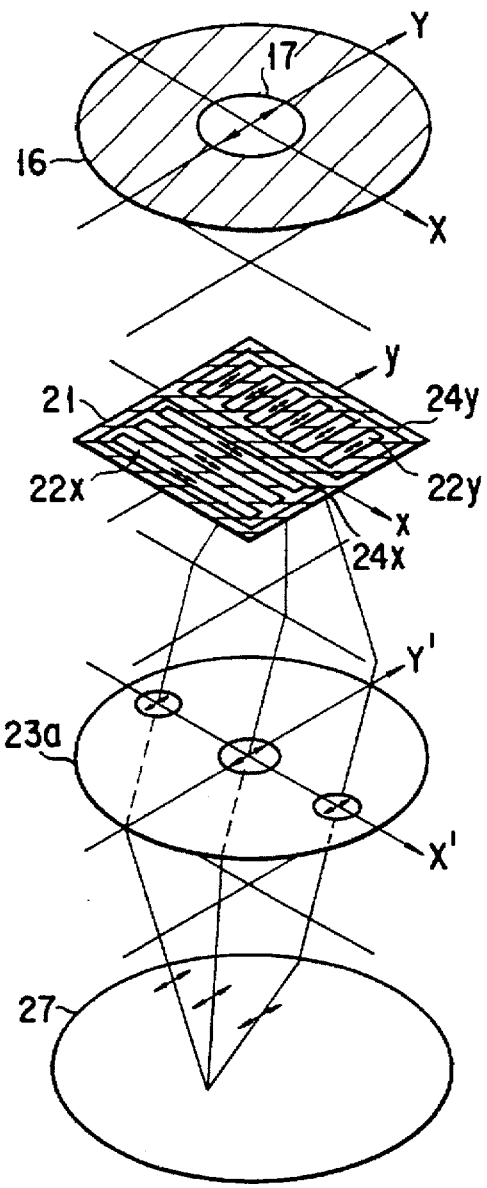 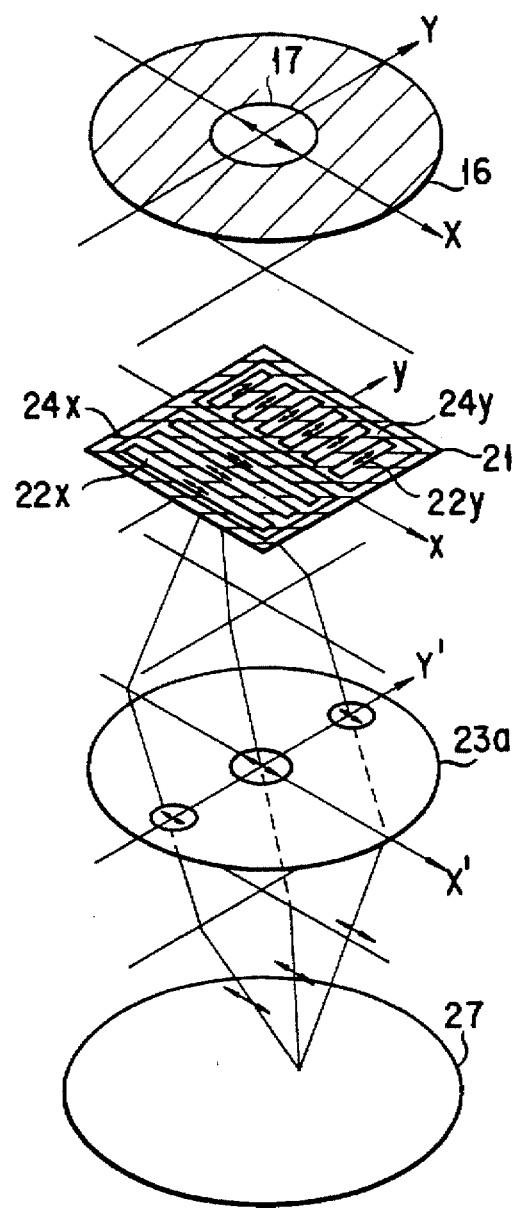
F I G. 15A    F I G. 15B

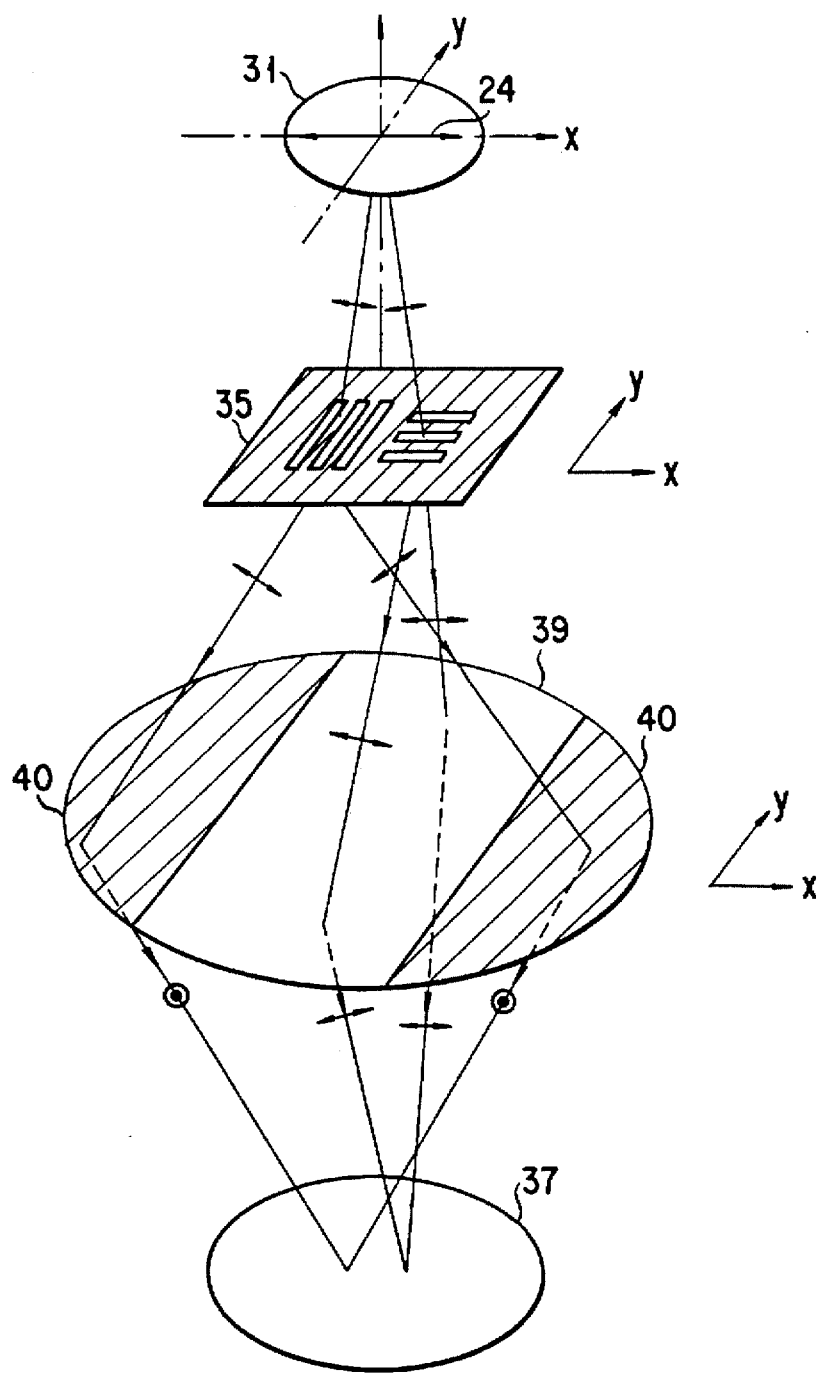
F I G. 16

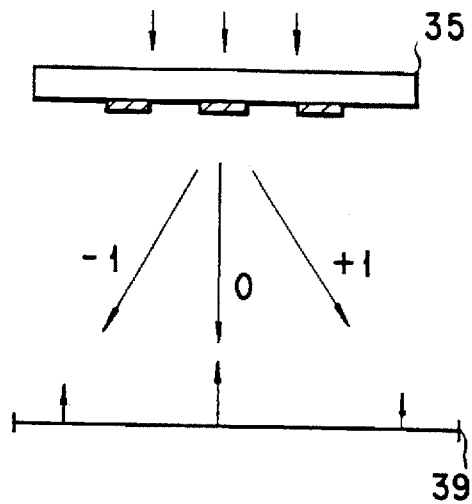
F I G. 17A
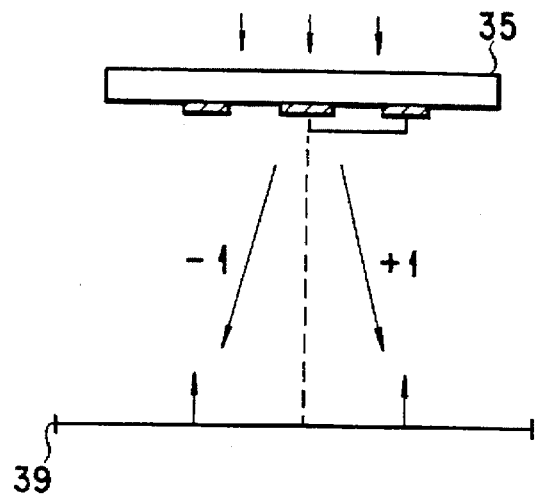
F I G. 17B
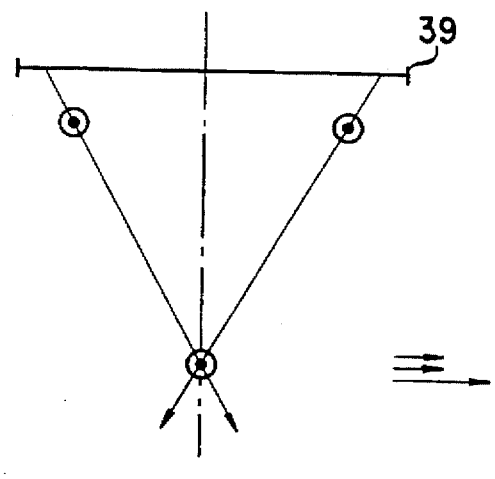
F I G. 18A
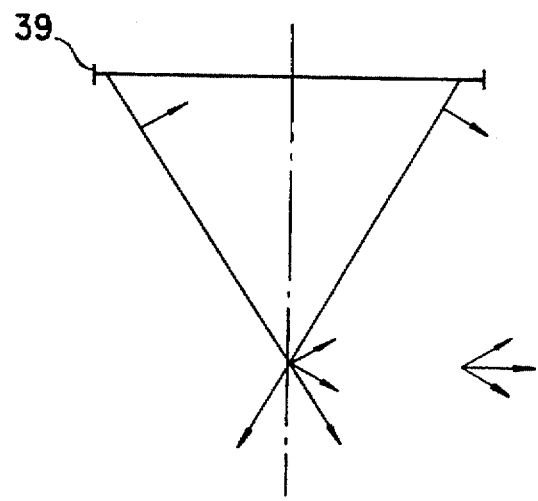
F I G. 18B

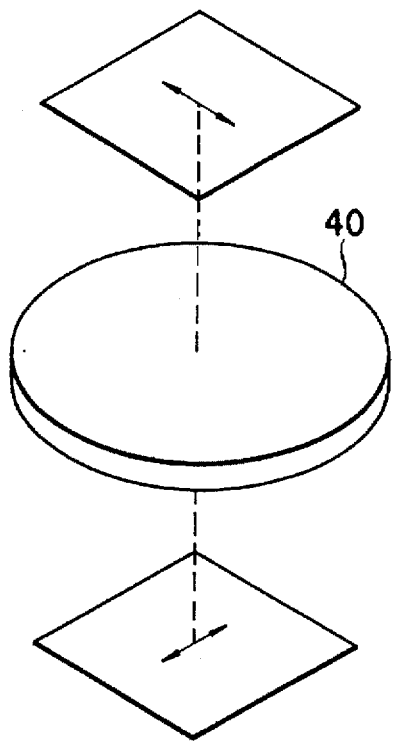
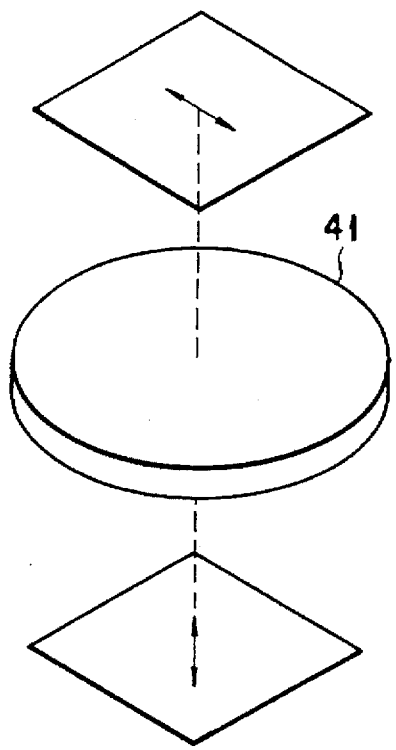
F I G. 19A    F I G. 19B
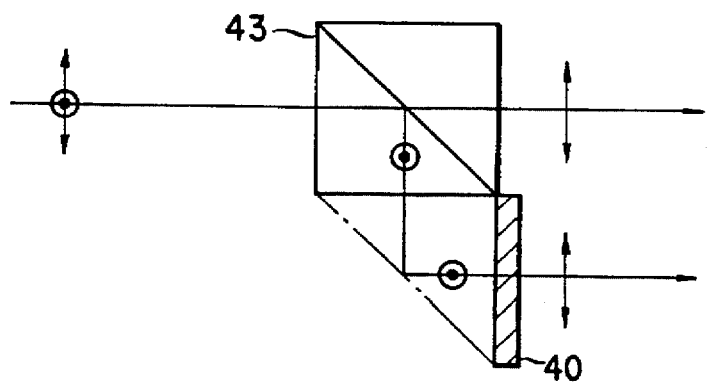
F I G. 20

EXPOSURE APPARATUS AND METHOD

This application is a continuation of application Ser. No. 08/311,342, filed on Sep. 23, 1994, now abandoned.

BACKGROUND OF THE INVENTION

1. Field of the Invention

The present invention relates to an exposure technique for forming fine patterns required for the manufacture of a semiconductor integrated circuit and, more particularly, to an exposure apparatus and method which use polarized light.

2. Description of the Related Art

Recently, the photolithographic technology has made remarkable advances. Finer resist patterns can now be formed on a wafer as the wavelength of exposure light (i-line: 365 nm) has decreased, the performance of a KrF excimer laser (248 nm) or projection exposure apparatus has improved, and especially the numerical aperture (NA) of a lens has increased.

FIG. 1 shows the schematic arrangement of a projection exposure apparatus which has been conventionally used in general. A light source 101, a first focusing optical system 102, a uniforming optical system 103, a second focusing optical system 104, a reticle 105, a projection optical system 106, and a wafer 107 are sequentially arranged in this order from the light source side. The first focusing optical system 102 includes an elliptic surface mirror and an input lens. In addition, a spherical mirror, a plane mirror, a lens, and the like are properly arranged in the first focusing optical system 102. The first focusing optical system 102 serves to input a light beam emitted from the light source 101 to the uniforming optical system 103 as efficiently as possible. The uniforming optical system 103 includes an optical integrator (fly-eye lens). Alternatively, an optical fiber, a polygonal prism, or the like may be used.

The second focusing optical system 104 includes an output lens and a collimation lens and serves to superpose light beams emerging from the uniforming optical system 103 and ensure image surface telecentricity. In addition, a filter for transmitting a wavelength which has undergone aberration correction is inserted at a place where a light beam is almost parallel to the optical axis, and a cold mirror is also inserted at a place which is not specifically limited.

In the apparatus having the above arrangement, when viewed from the reticle 105 in the direction in which light comes, the characteristics of the light are those of light emerging from the uniforming optical system 103 and passing through the second focusing optical system 104, and the light exit side of the uniforming optical system 103 becomes an apparent light source. For this reason, in the projection exposure apparatus having the arrangement shown in FIG. 1, a light exit side 108 of the uniforming optical system 103 is generally referred to as a secondary light source. When an image of the reticle 105 is projected on the wafer 107, the forming characteristics of projected/exposed patterns, i.e., resolution, depth of focus, and the like, are determined by the numerical aperture (NA) of the projection optical system 106 and the characteristics of a light beam irradiated on the reticle 105, i.e., the characteristics of the secondary light source 108.

If, however, the wavelength of exposure light is decreased and the NA of the projection optical apparatus is increased to increase the resolution so as to form fine resist patterns on the wafer 107, the depth of focus decreases, and the practical resolution does not increase much. For this reason, attempts have been made to increase the resolution and the depth of focus by changing the secondary light source intensity distribution, the reticle, and the complex transmittance distribution of the pupil plane of a projection optical system in a projection exposure apparatus from those in the conventional apparatus.

As a method of increasing the resolving power, a method which uses a specific mask is available. With this mask, the phase difference between exposure light beams passing through adjacent opening portions of a line-and-space pattern (to be referred to as an L/S pattern hereinafter) having one-dimensional periodicity such as a wiring pattern in an LSI becomes almost 180°. It is known that the resolution obtained by using this mask is about twice that obtained by using a conventional mask having L/S patterns formed on a transparent substrate by using a light-shielding material such as chromium (Jpn. Pat. Appln. KOKAI Publication No. 57-62052).

As methods using differences in interference property depending on the direction of polarization of light beams, a method using an improved light source (Jpn. Pat. Appln. KOKAI Publication No. 5-109601), a method using an improved pupil (Jpn. Pat. Appln. KOKAI Publication No. 5-90128), a method using an improved mask (Jpn. Pat. Appln. KOKAI Publication No. 5-88356), and the like are known.

In a method of forming a concentrical polarizer at the pupil position, the loss of the light amount of a polarized light component perpendicular to the polarized-light transmitting direction of the polarizer increases.

The method using an improved light source (Jpn. Pat. Appln. KOKAI Publication No. 5-109601) will be described below. In this method, the resolution of periodic patterns is increased by using polarization of light. FIG. 2 shows an exposure apparatus, as an apparatus used for this method, in which illumination light is polarized by a polarizer.

The exposure apparatus shown in FIG. 2 includes a polarizer 116a in an illumination optical system. Referring to FIG. 2, illumination light emitted from a light source 111 such as a mercury lamp is incident on the polarizer 116a via an elliptic surface mirror 112, a mirror 113, a focusing lens 114, and an optical integrator 115. The polarizer 116a is supported by a supporting member 117 and can be rotated about an optical axis Ax or an axis parallel thereto. This rotation is performed by, e.g., a motor (not shown) arranged on the supporting member 117. Therefore, an illumination light beam transmitted through the polarizer 116a becomes a light beam polarized (linearly polarized) in a direction corresponding to the rotating direction of the polarizer 116a.

The light beam passing through the polarizer 116a is guided by condenser lenses 118 and 120 and a mirror 119 to illuminate a pattern 122a on (lower surface of) a photomask (reticle) 121a. The transmitted and diffracted light from the photomask 121a is focused by a projection optical system 123, thereby forming an image of the mask pattern 122a on the surface of a wafer 124. In this case, if the mirror 119 is shifted from a position where the mirror is perpendicular or parallel to the oscillating direction of illumination light, linearly polarized light is converted into elliptically polarized light. Therefore, a careful consideration needs to be given to this point.

The polarizer 116a is used to set the direction of polarization of illumination light to be parallel to the longitudinal direction of the mask pattern 122a. With this operation, the contrast of a fine L/S pattern image can be improved, and hence the integrated circuit can be reduced in size. With regard to patterns other than fine one-dimensional L/S patterns, the required degree of micropatterning is relatively low. Therefore, even if polarization of illumination light is not accurately optimized with respect to the patterns, the resultant deterioration in contrast is very small.

Referring to FIG. 2, the light source 111 is a mercury lamp. However, another type of lamp or a laser source may be used. Especially when the light source is a laser for emitting linearly or circularly polarized light, a λ/2 or λ/4 plate can be used as a member for controlling the polarized state.

The following problems, however, are posed in an apparatus of this type. Actual LSI patterns include not only patterns elongated in a direction parallel to light linearly polarized by the polarizer 116a but also patterns elongated in directions perpendicular and oblique to the linearly polarized light. For this reason, although the resolving power and the depth of focus can be increased with respect to components parallel to the linearly polarized light, these effects cannot be expected with respect to patterns elongated in directions perpendicular and oblique to the linearly polarized light.

For this reason, in transferring actual LSI patterns, since the resolving power and the depth of focus are determined by the above vertical and oblique patterns, the practical resolving power and depth of focus cannot be increased.

As described above, in the conventional exposure apparatus using linearly polarized light, although the resolving power and the depth of focus with respect to components parallel to the direction of polarization are increased, such an effect cannot be expected with respect to patterns elongated in directions perpendicular and oblique to the linearly polarized light, and no practical increases in resolving power and depth of focus can be achieved.

Since the minimum line width of a fine mask pattern comes close to the wavelength of exposure light, the influence of diffracted light caused when the exposure light is transmitted through the pattern cannot be ignored, and it is difficult to ensure a sufficient light amount difference between bright and dark portions of a projected mask pattern image on a substrate to be exposed. As a result, the contrast at a bright/dark boundary decreases. In order to solve this problem, a method of increasing the resolution limit by changing the shape of a light source for illuminating a mask is proposed (Jpn. Pat. Appln. KOKAI Publication No. 4-180612).

FIG. 3 shows a conventional exposure apparatus based on this proposal. The exposure apparatus shown in FIG. 3 is the same as the apparatus shown in FIG. 2 except for a light-shielding plate 116b and a mask 121b. One-dimensional grating patterns 122b having a duty ratio of 0.5 are formed, as typical fine patterns, on the mask 121b extending in the vertical and horizontal directions (within the plane of the mask 121b). An illumination optical system for illuminating the mask 121b is constituted by a mercury lamp 111, an elliptic surface mirror 112, a cold mirror 113, a focusing optical element 114, an integrator 115, a relay lens 118 (pupil relay system), a mirror 119, and a condenser lens 120. The light-shielding plate 116b having four opening portions, each shifted from the optical axis by an amount determined by the degree of fineness of the mask patterns 122b, is arranged near the pupil plane (the Fourier transform plane; the light exit end face of the integrator 115 on which a secondary light source image of the mercury lamp 111 is formed) of the illumination optical system.

FIGS. 4A and 4B are plan views of the light-shielding plate 116b and the mask 121b, respectively. The hatched portions indicate light-shielding portions. FIG. 4C shows the exposure light distribution on a pupil plane (almost equivalent to a conjugate plane at the position of the light-shielding plate 116b) in the projection optical system 123. In practice, the light-shielding plate 116b and the mask 121b are arranged in the exposure apparatus such that the directions of the respective coordinate axes (X-axis,Y-axis) and (x-axis,y-axis) coincide with each other.

The optimal coordinate positions of the centers of circular opening portions in FIG. 4A are determined by the degree of fineness of mask patterns. If, for example, the pitch of the mask patterns is represented by p, since the grating patterns 122b include both vertical and horizontal patterns, the optimal coordinate positions (X,Y) of the centers of the opening portions are (½p,½p), (½p,–½p), (–½p,½p), and (–½p,–½p). The coordinate positions (X',Y') of the four peaks of the exposure light distribution in FIG. 4C become the same values.

As is apparent from this, as the pitch p of mask patterns decreases, the coordinate positions of the opening portions of the light-shielding plate 116b and the coordinate positions of the exposure light peaks at the pupil position of the projection optical system 123 are further shifted from the optical axis. Letting NA be the numerical aperture of the projection optical system, and λ be the wavelength of exposure light, the radius of the pupil shown in FIG. 4C is represented by NA/λ. Therefore, fine patterns expressed by the following equation correspond to the resolution limit.

$$\tfrac{1}{2}p = NA(2^{1/2}\lambda)$$

$$p = 2^{1/2}\lambda/2NA$$

In practice, since the opening portions of the light-shielding plate 116b have some areas, the resolution limit slightly varies depending on the areas. However, there is not much difference between these resolution limits. If the pitch p of mask patterns becomes smaller than the value expressed by the above equation, diffracted light is shifted outside the radius of the pupil. As a result, image formation can no longer be performed.

As described above, typical LSI patterns are constituted by one-dimensional grating patterns arranged in the vertical and horizontal directions. For this reason, in order to form images of both the vertical and horizontal patterns with high resolution, the four opening portions of the light-shielding plate arranged at the position of the secondary light source need to be arranged at 45° with respect to each pattern. Therefore, the resolution limit of the vertical and horizontal patterns is limited to $2^{1/2}\lambda/2NA$.

SUMMARY OF THE INVENTION

It is an object of the present invention to provide an exposure apparatus which can equally increase the resolving power and the depth of focus with respect to patterns extending in all directions, and can properly transfer even LSI patterns including both vertical and horizontal lines.

It is another object of the present invention to provide an exposure apparatus which can practically increase the resolution limit to λ/2NA.

According to the present invention, there is provided an exposure apparatus for projecting a plurality of patterns of a photomask, which are elongated in at least two different directions, onto a substrate through the photomask, comprising: a polarized light source for illuminating the photomask; polarization control means for changing a direction of polarization of polarized light from the polarized light source; a slit filter arranged at a position where the polarized light source is focused, and transmitting polarized light of a region elongated in a direction at a first angle with a polarization direction of the polarized light; means for changing a longitudinal direction of the slit filter in synchronism with a change in polarization direction of polarized light which is made by the polarization control means; and means for illuminating the photomask with the polarized light at each angle which a direction of the pattern is at a second angle with the polarization direction of the polarized light, thereby exposing a pattern of the photomask onto the substrate.

In addition, according to the present invention, there is provided an exposure method of projecting a plurality of patterns of a photomask, which are elongated in at least two different directions, onto a substrate through the photomask, comprising the steps of: illuminating the photomask by using a polarized light source; causing a slit filter arranged at a position where polarized light source is focused and transmitting polarized light of a region elongated in a direction at a first angle with a polarization direction of the polarized light to transmit polarized light passing through the photomask; changing the polarization direction of the polarized light; and changing a longitudinal direction of the slit filter in synchronism with a change in the polarization direction, and illuminating the photomask with the polarized light at each angle which a direction of the pattern is at a second angle with the polarization direction of the polarized light, thereby exposing a pattern of the photomask onto the substrate.

Furthermore, according to the present invention, there is provided an exposure apparatus for illuminating a photomask having first and second patterns respectively elongated in X-axis and Y-axis directions of an X-Y orthogonal coordinate system in a plane perpendicular to an optical axis having the optical axis as an origin, and exposing the patterns onto a substrate by using a projection optical system, comprising: a light-shielding plate arranged within a plane of an illumination optical system which corresponds to a conjugate plane of a pupil plane of the projection optical system, the light-shielding plate having at least one opening portion; first polarizing means for defining a polarization direction of light incident on the opening portion as polarized light which direction coincides with the X-axis or Y-axis direction; and second polarizing means for transmitting only polarized light, of light incident on the first pattern, which direction coincides with the X-axis direction, and transmitting only polarized light, of light incident on the second pattern, direction coincides with the Y-axis direction.

Moreover, according to the present invention, there is provided an exposure apparatus for illuminating a photomask having first and second patterns respectively elongated in X-axis and Y-axis directions of an X-Y coordinate system having an optical axis as an origin, and exposing the patterns onto a substrate by using a projection optical system, comprising: a light source which emits illumination light having a polarization direction defined at an angle of θ° with respect to the X-axis direction; and means, arranged on a pupil plane of the projection optical system, for rotating a direction of polarization of the illumination light through 90°−θ° in two regions located on an X-axis and symmetrical about the origin, and rotating the direction of polarization of the illumination light through θ° in two regions located on a Y-axis and symmetrical about the origin, thereby controlling a polarized state to align the direction of polarizations on the pupil plane.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a graph showing the result obtained by a simulation of transfer characteristics realized by an exposure method of the first embodiment;

FIG. 9A is a plan view of a light-shielding plate in the second embodiment of the present invention;

FIG. 9B is a plan view of a mask in the second embodiment of the present invention;

FIG. 9C is a view showing the exposure light distribution at the pupil point of a projection optical system in the exposure apparatus according to the second embodiment of the present invention;

FIGS. 10A and 10B are perspective views showing the exposure apparatus to explain the principle of exposure in the second embodiment of the present invention;

FIGS. 11A and 11B are plan views respectively showing light-shielding plates in the second embodiment of the present invention and the prior art;

FIG. 12 is a graph showing the result obtained by comparing calculated values in the second embodiment and the prior art;

FIGS. 13A to 13D are sectional views respectively showing the structures of various photomasks used in the second embodiment of the present invention;

FIGS. 15A and 15B are perspective views showing the schematic arrangement of a projection exposure apparatus according to a modification of the second embodiment of the present invention;

FIG. 16 is a perspective view showing the schematic arrangement of a projection exposure apparatus according to the third embodiment of the present invention;

FIGS. 17A and 17B are views showing how light is diffracted by a reticle pattern;

FIGS. 18A and 18B are views showing interference of light in an s-polarized state and a p-polarized state;

FIGS. 19A and 19B are views respectively showing cases wherein λ/2 and λ/4 plates are used;

FIG. 20 is a view showing a case wherein the loss of light amount is suppressed by using a polarizing beam splitter and a λ/2 plate.

DETAILED DESCRIPTION OF THE PREFERRED EMBODIMENTS

Various embodiments of the present invention will be described below with reference to the accompanying drawings.

Figure 5:
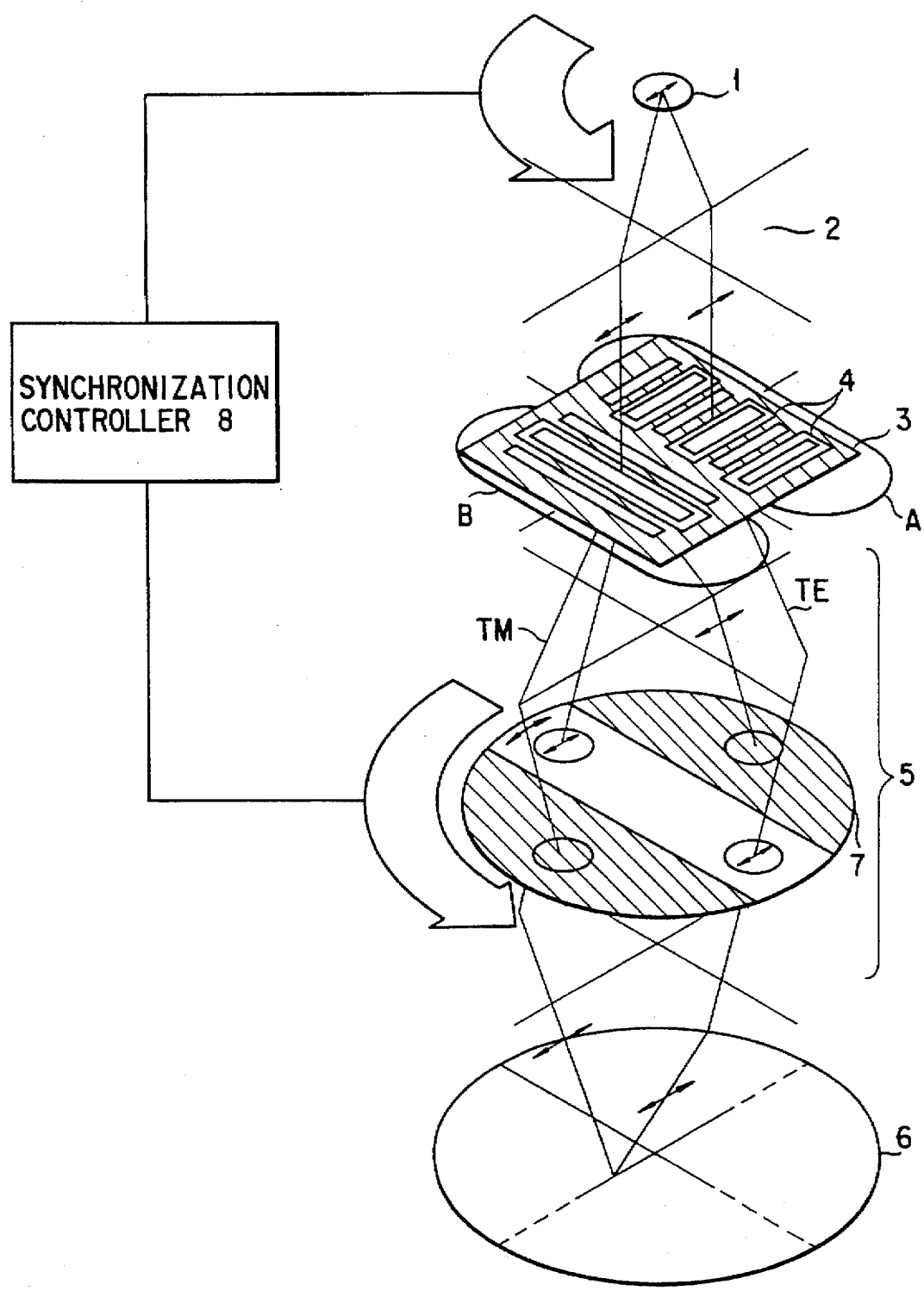
FIG. 5 is a view showing the schematic arrangement of an exposure apparatus according to the first embodiment of the present invention.

FIG. 5 shows the schematic arrangement of an exposure apparatus according to the first embodiment of the present invention. In the exposure apparatus shown in FIG. 5, a polarizer 1 and a slit filter 7 are respectively arranged in an illumination optical system and a projection optical system. Referring to FIG. 5, illumination light emitted from a light source such as a mercury lamp is incident on the polarizer 1 via an elliptic surface mirror, a mirror, a focusing lens, and an optical integrator (not shown).

A linearly polarized light beam transmitted through the polarizer 1 is guided by a condenser lens 2 to illuminate a pattern of a photomask (reticle) 3. As this photomask 3, a general mask having light-shielding and light-transmitting portions or a phase shift mask may be used. FIG. 5 shows a so-called alternating phase shift mask in which phase shifters 4 are arranged in every other opening portions which are periodically formed.

Transmitted/diffracted light from the photomask 3 passes through a projection optical system 5 to form an image of the mask pattern on a wafer 6. The slit filter 7 is arranged at or near the pupil position of the projection optical system 5. A region (opening portion) of the slit filter 7 which transmits exposure light has a slit-like shape or an equivalent like shape.

The polarizer 1 and the slit filter 7 are arranged such that the direction of polarization of linearly polarized light formed by the polarizer 1 is perpendicular to the longitudinal direction of the slit filter 7. The exposure apparatus includes a synchronization controller 8 for synchronously rotating the polarizer 1 and the slit filter 7 about the optical axis while holding this positional relationship.

In this arrangement, when exposure is performed in the state shown in FIG. 5, a periodic pattern A elongated in a direction parallel to the direction of polarization is transferred, whereas a periodic pattern B elongated in a direction perpendicular to the direction of polarization is not transferred. In this case, the periodic pattern A is transferred in the TE mode, as described above when exposure is performed after the polarizer 1 and the slit filter 7 are rotated through 90°, the periodic pattern B elongated in a direction parallel to the direction of polarization in this state is transferred, but the periodic pattern A is not transferred. In this case, the periodic pattern B is transferred in the TE mode, as described above.

Although not shown in FIG. 5, if a 45° pattern exists, exposure is further performed after the polarizer 1 and the slit filter 7 are rotated through 45°. If there is an oblique pattern other than a 45° pattern, exposure is performed after the polarizer 1 and the slit filter 7 are rotated through a corresponding angle.

The principles of the exposure apparatus and method according to the first embodiment of the present invention will be described below with reference to FIG. 5.

When linearly polarized light passing through the polarizer 1 is used as a light source, an image of the periodic pattern A elongated in a direction parallel to the direction of polarization is formed by scalar interference (TE mode), while an image of the periodic pattern B elongated in a direction perpendicular to the direction of polarization is formed by vector interference (TM mode). An image formed by scalar interference has an electric field amplitude synthesized by a scalar sum, and hence exhibits good image contrast. An image formed by vector interference has an amplitude synthesized on an image surface by a vector sum, and hence has low image contrast. This tendency becomes more conspicuous as the pattern size decreases. Therefore, only the resolving power of patterns A can be increased by arranging the slit filter 7, which transmits only TE mode light advantageous in image formation, at the pupil position. Since a spectrum from the pattern B, which is TM mode light, does not reach the image surface, no image of the pattern B is formed. In other words, no pattern elongated in a direction perpendicular to the direction of polarization is transferred.

Subsequently, the polarizer 1 and the slit filter 7 are rotated through 90°, and exposure is further performed. In this state, since a periodic pattern elongated in a direction parallel to the direction of polarization becomes the pattern B, diffracted light from the pattern B causes scalar interference (TE mode), and the image contrast is improved. Diffracted light from the pattern A which is the TM mode in this state is shielded by the slit filter 7 and does not reach the image surface. For this reason, even an actual device pattern having both vertical and horizontal lines can be properly transferred.

FIG. 6 shows the result obtained by a simulation of transfer characteristics realized by the exposure method of this embodiment. Referring to FIG. 6, the abscissa represents the line width of a line-and-space pattern; and the ordinate, DOF (depth of focus). The depth of focus is defined by image contrast. Three types of resists which can resolve images with image contrasts of 40%, 50%, and 60% are assumed. The solid line indicates the TE mode; the broken line, the TM mode; and the alternate long and short dashed line, nonpolarized light.

It is apparent from this result that the depth of focus with the TE mode is much larger than that with nonpolarized light. It is also apparent that the depth of focus with the TM mode is smaller than that with nonpolarized light. Therefore, image formation by light of the TM mode must be avoided. From the above description, the effectiveness of the slit filter 7 is clearly understood.

As described above, according to this embodiment, the polarizer 1 is arranged in the illumination optical system, while the slit filter 7 is arranged at the pupil position of the projection optical system. With this arrangement, periodic patterns can be transferred only with the TE mode by synchronously rotating the polarizer 1 and the slit filter 7. Therefore, the same effect of increasing the resolving power and the depth of focus can be expected for not only patterns extending in one direction but also patterns extending in all directions. Even LSI patterns having both vertical and horizontal lines can be properly transferred.

Figure 7:
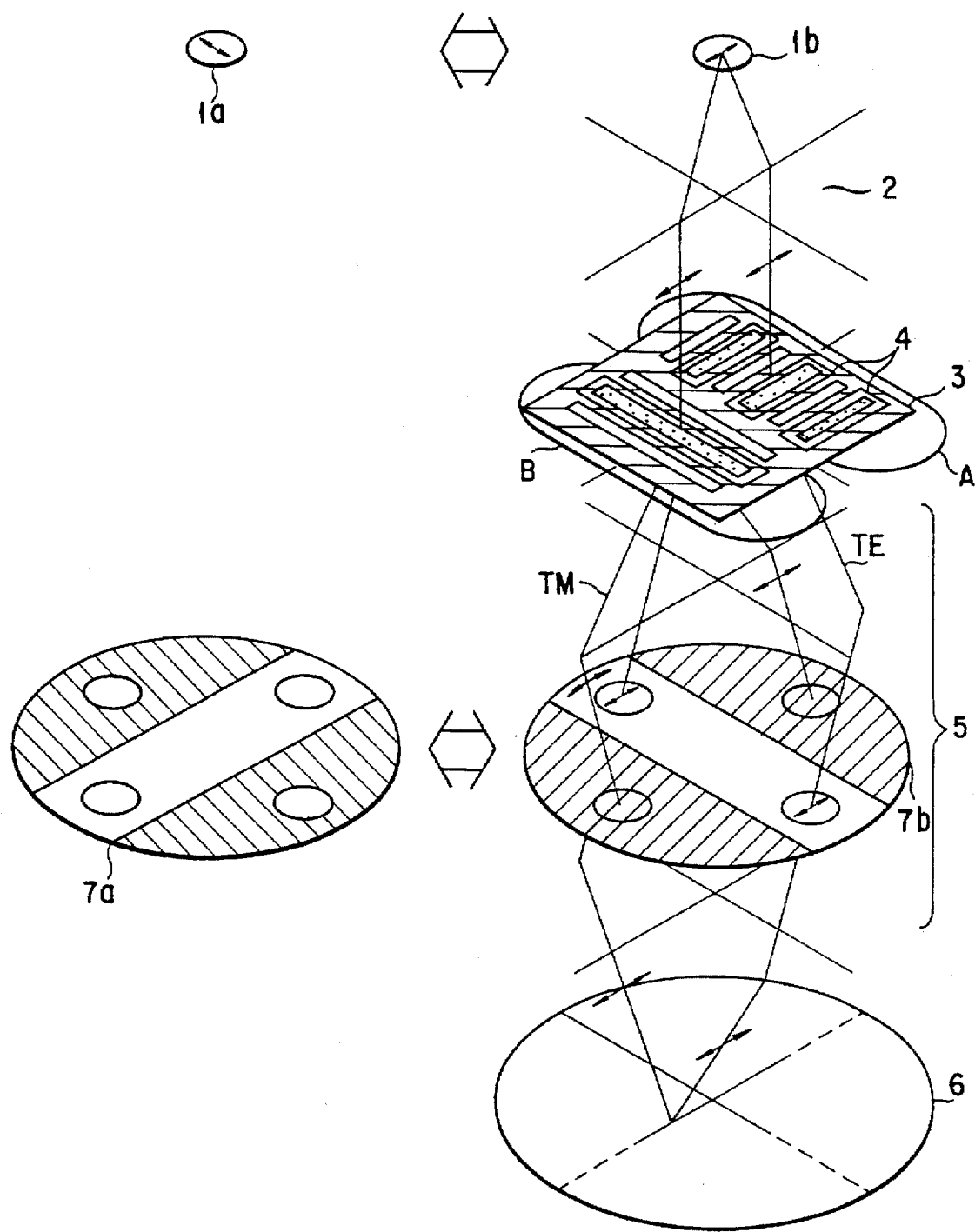
FIG. 7 is a view showing the schematic arrangement of a modification of the exposure apparatus according to the first embodiment of the present invention.

In the embodiment shown in FIG. 5, the polarizer 1 and the slit filter 7 are synchronously rotated. However, the present invention is not limited to this. For example, as shown in FIG. 7, the apparatus may use a switching mechanism for synchronously sliding polarizers 1a and 1b, the direction of polarization of which are perpendicular to each other, and slit filters 7a and 7b, the longitudinal directions of the slits of which are perpendicular to each other.

That is, the apparatus may include a mechanism capable of performing exposure a plurality of number of times at a plurality of angles with respect to the optical axis while holding the positional relationship between the direction of polarization of illumination light and a slit such that the direction of polarization and the longitudinal direction of the slit are perpendicular to each other.

The present invention is not limited to the above-described embodiment. In the above embodiment, a mercury lamp is used as a light source. However, a different type of lamp or a laser source may be used. Especially, when a laser for emitting linearly or circularly polarized light or a radiation source is used as a light source, a λ/2 or λ/4 plate may be set as a member for controlling the polarized state. In the embodiment, an alternating shift mask is used as a mask. However, the present invention is not limited to this, and a different phase shift mask may be used. For example, a binary mask, a halftone phase shift mask, a rim type shift mask, or a shifter-only phase shift mask may be used. Various other modifications and changes can be made within the gist of the present invention.

In the embodiment shown in FIG. 5, the polarizer 1 and the slit filter 7 are arranged such that the polarization direction of polarized light formed by the polarizer 1 is perpendicular to the longitudinal direction of the slit filter 7. However, the present invention is not limited to this arrangement. The polarization direction of polarized light formed by the polarizer 1 may be parallel to the longitudinal direction of the slit filter 7.

Figure 8:
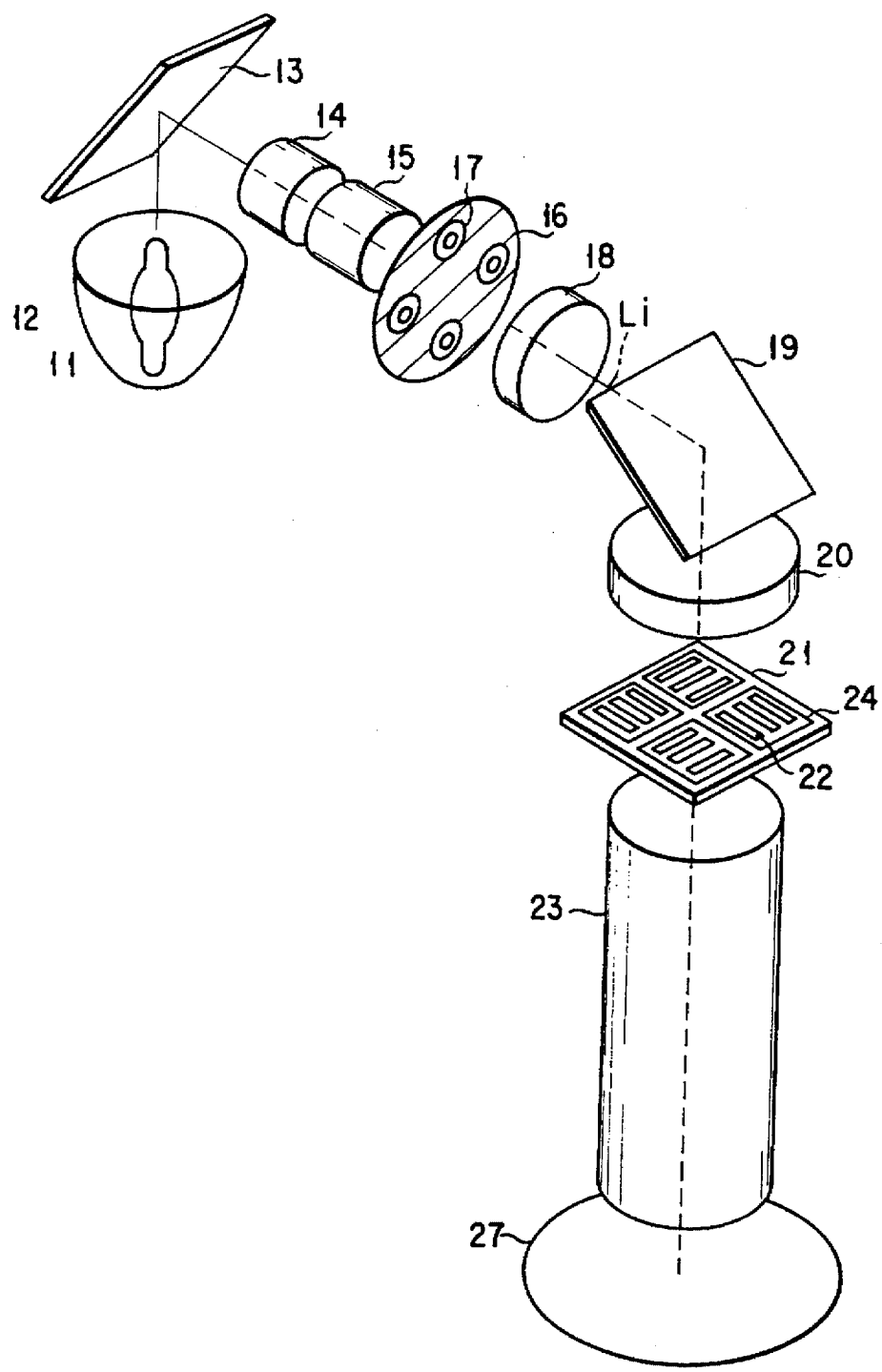
FIG. 8 is a perspective view showing the schematic arrangement of a projection exposure apparatus according to the second embodiment of the present invention.

FIG. 8 is a perspective view showing the schematic arrangement of a projection exposure apparatus according to the second embodiment of the present invention. One-dimensional grating patterns 22 having a duty ratio of 0.5 are formed, as typical fine patterns, on a mask 21 in the vertical and horizontal directions. In addition, polarizing members (to be referred to as an "analyzer" hereinafter) 24, each of which transmits only a light component, of exposure light, which has a predetermined direction of polarization, are formed on or near the grating patterns 22. An illumination optical system for illuminating the mask 21 is constituted by a mercury lamp 11, an elliptic surface mirror 12, a cold mirror 13, a focusing optical element 14, an integrator 15, a relay lens 18 (pupil relay system), a mirror 19, and a condenser lens 20. A light-shielding plate 16 having four opening portions is arranged near the pupil plane (the Fourier transform plane; in this case, the light exit end face of the integrator 15 on which a secondary light source image of the mercury lamp 11 is formed) of the illumination optical system. The off-axis amount of each opening portion of the light-shielding plate 16 is determined in accordance with the degree of fineness of the mask patterns 22. Polarizers 17, each of which transmits only a light component, of exposure light, which has a predetermined direction of polarization, are formed at or near the opening portions.

In the exposure apparatus having the above arrangement, exposure light emitted from the mercury lamp 11 arranged at the first focal point of the elliptic surface mirror 12 is reflected by the elliptic surface mirror 12 and the cold mirror 13 and is focused on the second focal point of the elliptic surface mirror 12. Thereafter, the exposure light passes through the focusing optical element 14 constituted by a collimator lens, a conical prism for light beam distribution correction, and the like, and forms a practical plane light source at the position of the light-shielding plate 16 through the integrator 15 constituted by a fly-eye lens group. This plane light source should serve to supply the exposure light, which is incident at various incident angles, to the mask 21 from above, similar to the prior art. However, since the light-shielding plate 16 is arranged, only light beams incident on the four opening portions of the light-shielding plate 16 can be transmitted through the light-shielding plate 16. The direction of polarizations of the light beams passing through the four opening portions are defined by the polarizers 17 and illuminate the mask 21 via the relay lens 18, the mirror 19, and the condenser lens 20.

The direction of polarizations of the illumination light beams are further defined by the analyzer 24, so that the light beams incident on the patterns 22 of the mask 21 are diffracted after they are transmitted through the mask 21. The diffracted light beams are incident on a projection optical system 23 to form spots of different orders on the pupil plane. Thereafter, the light beams pass through the projection optical system 23 to form reduced image on a wafer 27.

Figure 3:
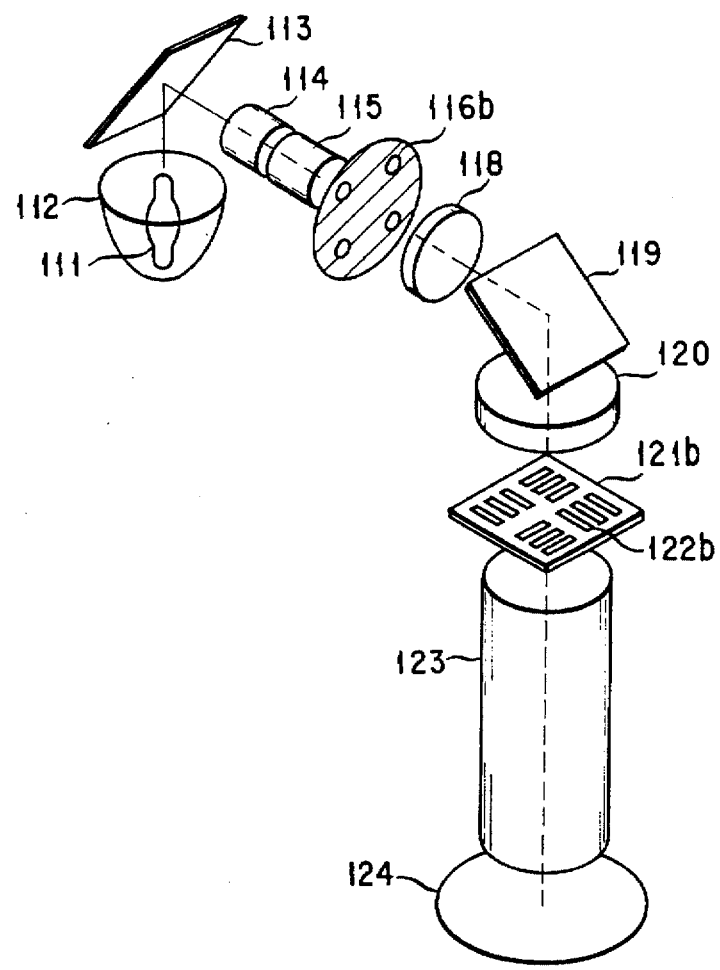
FIG. 3 is a perspective view showing a conventional apparatus which increases the resolution limit by changing the shape of a light source.
Figure 4A:
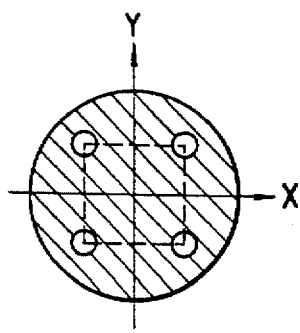
FIG. 4A is a plan view of a light-shielding plate used in the exposure apparatus shown in FIG. 3.
Figure 4B:
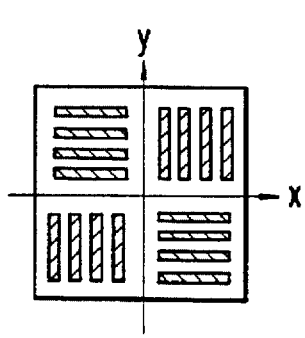
FIG. 4B is a plan view of a photomask used in the exposure apparatus shown in FIG. 3.
Figure 4C:
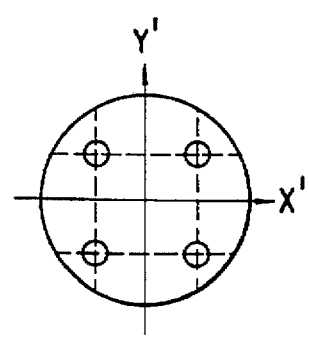
FIG. 4C is a view showing the exposure light distribution at the pupil point of a projection optical system in the exposure apparatus shown in FIG. 3.

The apparatus of this embodiment is different from the prior art shown in FIG. 3 in the method of arranging the light-shielding plate 16, and the newly added polarizer 17 and analyzer 24. FIGS. 9A and 9B are plan views respectively showing the light-shielding plate 16 and the polarizing member 17, and the mask 21, the one-dimensional grating patterns 22, and the polarizing members 24. Referring to FIGS. 9A and 9B, the hatched portions indicate light-shielding portions, and the arrows indicate the polarization directions of light beams which are defined by the polarizer 17 and analyzer 24, respectively. That is, only light beam components having electric fields oscillating in the directions indicated by the arrows can pass through the polarizer 17 and analyzer 24.

FIG. 9C shows the exposure light distribution on the pupil plane (almost equivalent to a conjugate plane at the position of the light-shielding plate 16) in the projection optical system 23. Referring to FIG. 9C, the arrows indicate the polarizations direction of exposure light which have reached the pupil plane. The two peaks on the X'-axis indicate diffracted light beams which have reached from grating patterns parallel to the y-axis (to be referred to as y patterns 22y); and the two peaks on the Y'-axis, diffracted light which have reached from grating patterns parallel to the x-axis (to be referred to as x patterns 22x). In an actual exposure apparatus, the respective coordinate axes in FIGS. 9A to 9C, i.e., the X- and Y-axes, the x- and y-axes, and X'- and Y'-axes, are arranged such that their directions coincide with each other.

As is apparent from the comparison between FIGS. 4A to 4C and FIGS. 9A to 9C, the opening portions of the light-shielding plate 16 are located in directions parallel and perpendicular to the directions of the grating patterns 22x and 22y, unlike the opening portions of the light-shielding plate 16 in the prior art, which are located at 45° with respect to the directions of the grating patterns 22x and 22y.

The optimal coordinate positions of the centers of the circular opening portions in FIG. 9A are determined by the degree of finesse of mask patterns. If, for example, the pitch of the mask patterns is represented by p, the optimal coordinate positions of the centers of the opening portions are (½p,0), (-½p,0), (0,½p), and (0,-½p). The coordinate positions (X',Y') of the four peaks of the exposure light distribution in FIG. 9C become the same values. As is apparent from this, as the pitch p of mask patterns decreases, the coordinate positions of the opening portions of the light-shielding plate 16 and the coordinate positions of the exposure light peaks at the pupil position of the projection optical system 23 are shifted from the optical axis. Letting NA be the numerical aperture of projection optical system 23, and λ be the wavelength of exposure light, the radius of the pupil in FIG. 9C is expressed by NA/λ. Therefore, fine patterns expressed by the following equations exhibit the resolution limit.

$$\tfrac{1}{2}p = NA/\lambda$$

$$p = \lambda/2NA$$

In practice, since the opening portions of the light-shielding plate 16 have some areas, the resolution limit slightly varies depending on the size of areas. However, there is not much difference between these resolution limits. According to the prior art, the resolution limit is $p=2^{1/2}\lambda/2NA$. In this embodiment, however, the resolution limit is $p=\lambda/2NA$, which is practically $2^{1/2}$ times that in the prior art. In addition, unlike the prior art, since images of both the y and x patterns are formed by only polarized light components (s-polarized light components) perpendicular to the incident plane of the wafer 27, the resolution limit and the depth of focus can be further increased.

The principle of exposure performed by this embodiment will be described in more detail below with reference to FIGS. 10A and 10B. FIGS. 10A and 10B are perspective views showing the exposure apparatus of the embodiment. Illumination light beams from opening portions 16a and 16c of the four opening portions of the light-shielding plate 16 contribute to exposure of the y pattern with the same effect so as to increase the resolution limit and the depth of focus. Illumination light beams from opening portions 16b and 16d contribute to exposure of the x pattern with the same effect so as to increase the resolution limit. Exposure operations respectively performed by using illumination light beams from the opening portions 16a and 16b will be described below as typical examples. FIG. 10A is a perspective view for explaining exposure by an illumination light beam from the opening portion 16a. FIG. 10B is a perspective view for explaining exposure by an illumination light beam from the opening portion 16b.

Exposure by an illumination light beam from the opening portion 16a will be described first with reference to FIG. 10A. An illumination light beam emerging from the opening portion 16a illuminates the mask 21 via the illumination optical system. This illumination light beam is linearly polarized in the y-axis (Y-axis) direction by a polarizer (not shown) arranged near the opening portion 16a. The analyzers 24 are arranged on and near the mask 21 in correspondence with the directional properties of mask patterns. More specifically, an analyzer 24y for allowing only linearly polarized light parallel to the y-axis to pass therethrough is arranged for each y pattern 22y, whereas an analyzer 24x for allowing only linearly polarized light parallel to the x-axis to pass therethrough is arranged for each x pattern 22x. In this arrangement, since the illumination light beam from the opening portion 16a is linearly polarized in the y-axis (Y-axis) direction, the light beam can pass through the analyzer 24y at the y pattern 22y, but cannot pass through the analyzer 24x at the x pattern 22x. The illumination light beam passing through the y pattern 22y is diffracted to pass through a pupil position 23a of the projection optical system. As a result, an image of the y pattern 22y is formed on the wafer 27.

In image formation by illumination light beams from the opening portions 16a and 16c, only the y pattern 22y is transferred, but the x pattern 22x is not transferred at all. In this exposure operation, since image formation is performed by only polarized light components perpendicular to the incident plane of the wafer 27, an image with very high contrast can be obtained.

Exposure by an illumination light beam from the opening portion 16b will be described with reference to FIG. 10B. An illumination light beam from the opening portion 16b is linearly polarized in the x-axis (X-axis) direction by a polarizer (not shown) arranged near the opening portion 16b. For this reason, the illumination light beam can pass through the analyzer 24x at the x pattern 22x, but cannot pass through the analyzer 24y at the y pattern 22y. The illumination light beam passing through the x pattern 22x is diffracted to pass through the pupil position 23a of the projection optical system. As a result, an image of the x pattern 22x is formed on the wafer 27. As described above, in image formation by illumination light beams from the opening portions 16b and 16d, only the x pattern 22x is transferred, but the y pattern 22y is not transferred at all. Similar to the above description, since image formation is performed by only polarized light components perpendicular to the incident plane of the wafer 27 in this exposure operation, an image with very high contrast can be obtained.

FIGS. 11A, 11B, and 12 show the results of this embodiment. FIGS. 11A and 11B are plan views respectively showing light-shielding plates used for the exposure method of this embodiment and the conventional exposure method. In the exposure scheme of the embodiment, the coordinates (X,Y) of the opening portions are (0.9NA/λ,0), (-0.9NA/λ, 0), (0,0.9NA/λ), and (0,-0.9NA/λ). In the conventional exposure scheme, the coordinates are (0.9×2$^{1/2}$NA/2λ,0.9× 2$^{1/2}$NA/2λ), (0.9×2$^{1/2}$NA/2λ,-0.9×2$^{1/2}$NA/2λ), (-0.9×2$^{1/}$ $_2$NA/2λ,0.9×2$^{1/2}$NA/2λ), and (-0.9×2$^{1/2}$NA/2λ,-0.9×2$^{1/}$ $_2$NA/2λ).

As shown in FIG. 11A, in this embodiment, the polarizers are arranged near the opening portions such that the polarization direction of exposure light beams transmitted through the opening portions are defined in the direction indicated by the arrows. The radii of the circular opening portions in both the embodiment and the prior art are set to be 0.1NA/λ. FIG. 12 shows the result obtained by calculating an image intensity distribution (corresponding to one period) on a substrate to be exposed in each scheme when exposure is performed by using line-and-space patterns having a line width of 0.17 μm as mask patterns under the following exposure conditions: NA=0.5 and λ=250 nm. As is apparent from FIG. 12, the resolution limit in the exposure scheme of the embodiment is much higher than that in the conventional exposure scheme.

FIGS. 13A to 13D show the structures of various masks used in this embodiment. Each of FIGS. 13A to 13D is a sectional view of a portion of the mask 21 shown in FIGS. 8 and 9B. FIGS. 13A and 13B show negative masks, in which grating patterns 22 are covered with a light-shielding film, and resist patterns are formed at positions corresponding to periodic opening portions by using a negative resist. When such a mask is to be used, the analyzer 24 may be formed on the light-shielding film of the mask, as shown in FIG. 13A, or may be formed on the lower surface of the mask, as shown in FIG. 13B.

Assume that the apparatus uses a positive mask, in which grating patterns are not covered with a light-shielding film, and resist patterns are formed at positions corresponding to periodic light-shielding portions by using a positive resist. In this case, if an analyzer is formed on a light-shielding film, a phase difference in exposure light occurs at an edge portion of the analyzer, resulting in forming an unnecessary dark portion. For this reason, the analyzer 24 may be formed apart from the imaging surface, e.g., on the lower surface of the mask, as shown in FIG. 13C. Alternatively, a flat plate constituted by the polarizer 24 as an analyzer may be arranged independently of the mask, as shown in FIG. 13D.

In the above embodiment, the light-shielding plate 16 has circular opening portions. However, the present invention is not limited to this, and the light-shielding plate 16 may have opening portions other than circular opening portions, e.g., square or sectorial opening portions. The positions of the opening portions of the light-shielding plate and the polarizations directions of polarizers arranged at the opening portions and mask patterns need not be strictly specified, but may vary within the range in which the effects of the present invention can be obtained.

Figure 14A:
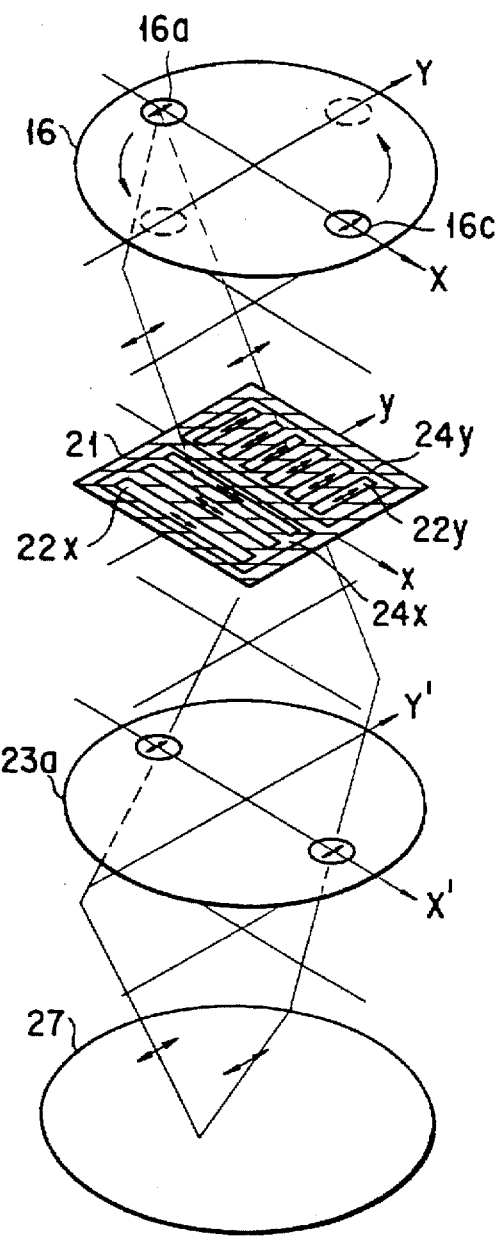
FIGS. 14A and 14B are perspective views of the schematic arrangements of projection exposure apparatuses according to modifications of the second embodiment of the present invention.
Figure 14B:
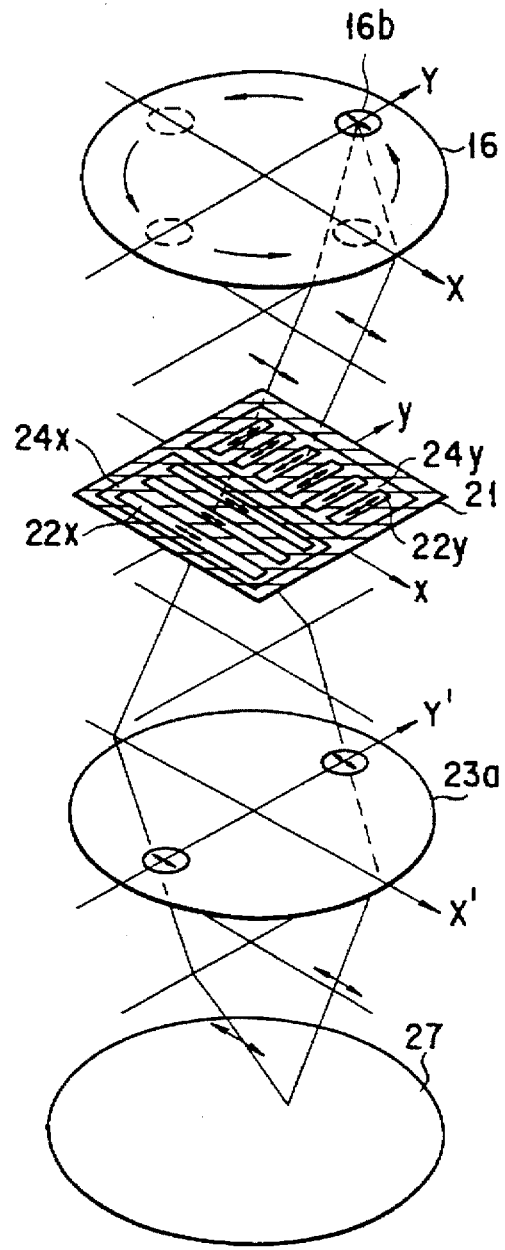

In the second embodiment of the present invention, the light-shielding plate 16 has four opening portions. A light-shielding plate having two opposing opening portions, as shown in FIG. 14A, or a light-shielding plate having one opening portion formed at a position shifted from the optical axis, as shown in FIG. 14B, may be used. In this case, the same effects as described above can be obtained by performing multiple exposure while rotating the light-shielding plate 90° at a time. Alternatively, a light-shielding plate having two opening portions located at 90° with respect to the optical axis may be rotated through 180° to perform multiple exposure. Furthermore, exposure may be performed by sequentially switching a plurality of light-shielding plates, each having an opening portion at a predetermined position, instead of rotating a light-shielding plate.

In addition, as shown in FIGS. 15A and 15B, a light-shielding plate having one opening portion at or near the optical axis may be used. This light-shielding plate has a polarizer so that only a specific linearly polarized light beam can pass through the plate. When exposure is performed in the state shown in FIG. 15A, a region 22y is properly transferred onto a wafer 27. When exposure is performed in the state shown in FIG. 15B, a region 22x is properly transferred onto the wafer 27.

The present invention is not limited to the above-described embodiment. In the above embodiment, a mercury lamp is used as a light source. However, a different type of lamp or a laser source may be used. Especially, when a laser for emitting linearly or circularly polarized light or a radiation source is used as a light source, a $\lambda/2$ or $\lambda/4$ plate may be set as a member for controlling the polarized state. In the embodiment, a binary mask with an analyzer is used as a mask. However, the present invention is not limited to this, and some kinds of phase shift masks with the analyzer may be used. For example, an alternating phase shift mask, a halftone phase shift mask, a rim type shift mask, or a shifter-only phase shift mask may be used. Various other modifications and changes can be made within the gist of the present invention.

In the above embodiment, the direction of polarizations at the opening portions 16a, 16c are set to perpendicular to the X axis, and the direction of polarizations at the opening portions 16b, 16d are set to perpendicular to the Y axis. In addition, the direction of polarization at y pattern is set to parallel to the y axis, and the direction of polarization at x pattern is set to parallel to the x axis. However, the present invention is not limited to these arrangements. The direction of polarizations at the opening portions 16a, 16c may be set to parallel to the X axis, and the direction of polarizations at the opening portions 16b, 16d may be set to parallel to the Y axis. In addition, the direction of polarization at y pattern may be set to perpendicular to y axis, and the direction of polarization at x pattern may be set to perpendicular to x axis.

Figure 1:
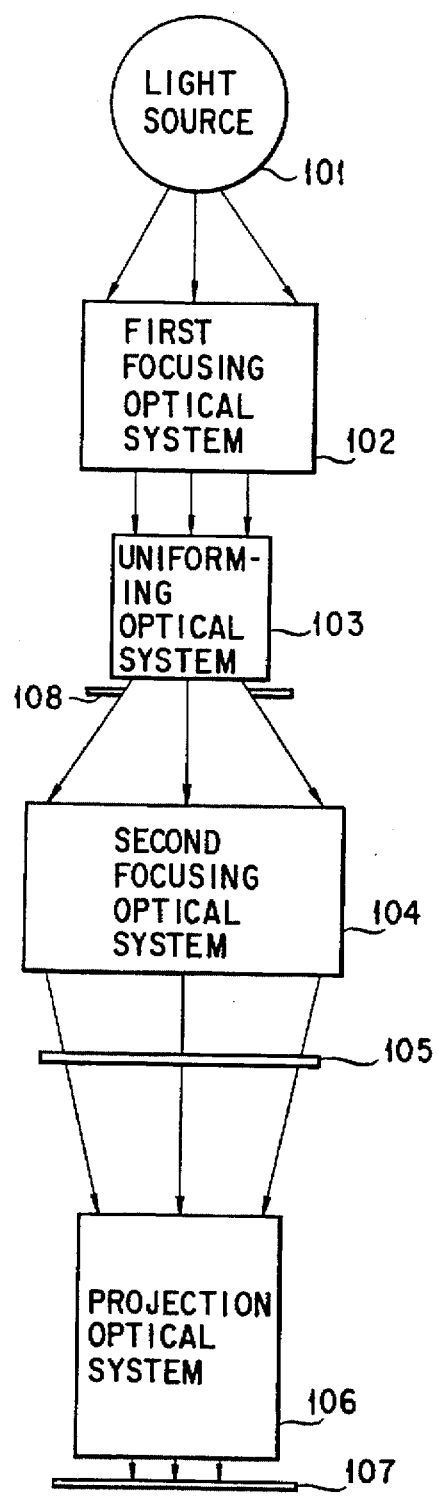
FIG. 1 is a block diagram showing the schematic arrangement of a generally used conventional exposure apparatus.
Figure 2:
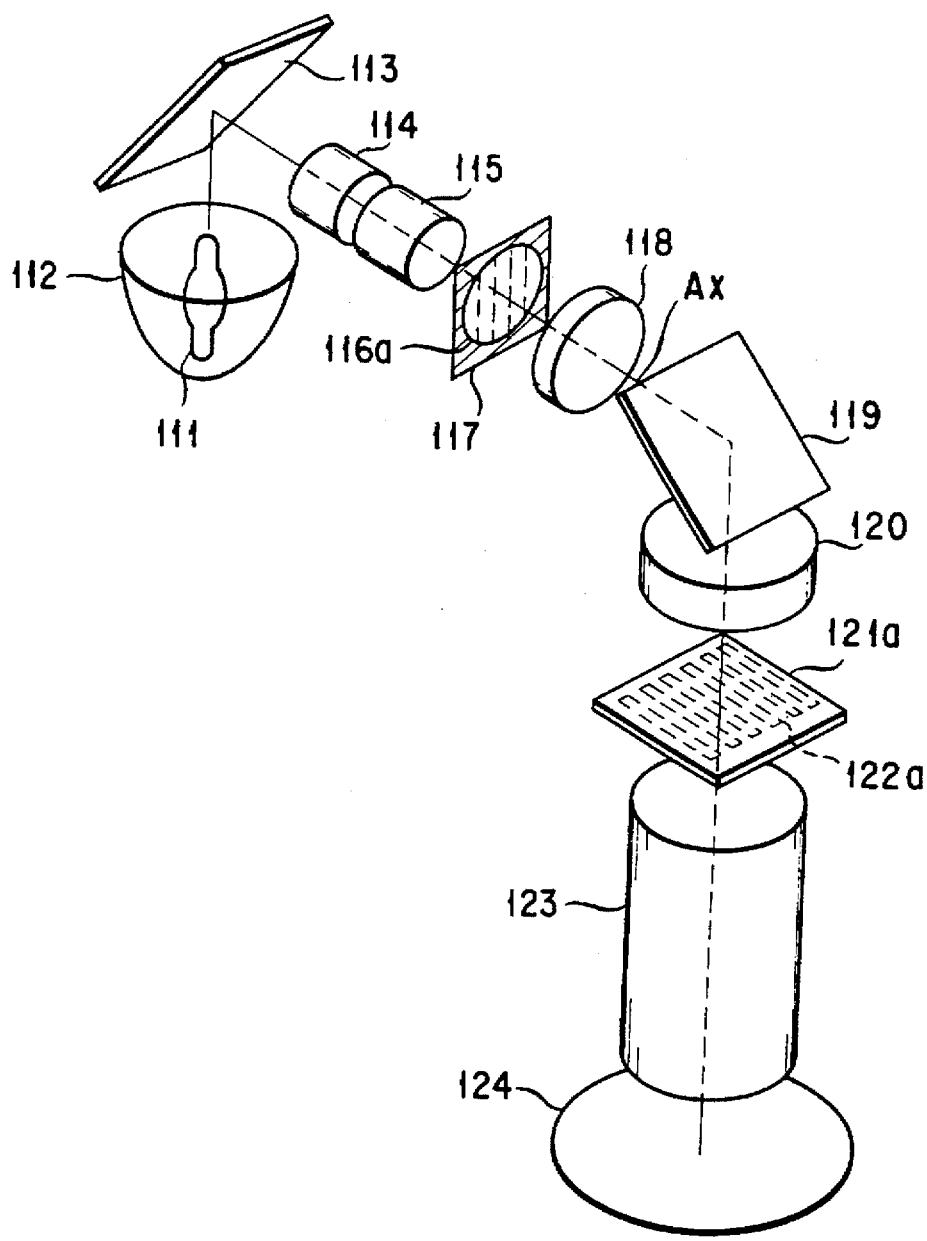
FIG. 2 is a perspective view showing a conventional exposure apparatus in which illumination light is polarized by a polarizer.

FIG. 16 is a perspective view showing the schematic arrangement of an exposure apparatus according to the third embodiment of the present invention. The basic arrangement of the exposure apparatus of this embodiment is the same as that of the conventional apparatus shown in FIG. 2, but is different therefrom in the pupil of the projection optical system and mask shown in FIG. 16.

As shown in FIG. 16, linearly polarized light is used as a light source 31. The direction of polarization of the light source 31 is set to almost coincide with a given direction of periodic directions of line-and-space patterns. A polarizer 40 for rotating the direction of polarization of the light source 31 through about 90° with respect to a region limited in the direction of polarization is arranged at a pupil position 39 of the projection optical system.

The principle of an improvement in resolving power in this embodiment will be described below. When line-and-space patterns on a reticle 35 are illuminated by a point light source (equivalent to coherent illumination) from above the optical axis of an illumination optical system, a diffracted light distribution like the one shown in FIGS. 17A and 17B is set on a pupil plane 39 of a projection optical system. FIG. 17A shows the case where an ordinarily binary mask is employed, and FIG. 17B shows the case where an alternating shift mask is used as a mask. This distribution is the one obtained by performing Fourier transform of the patterns on the reticle 35. In this case, since it is assumed that the patterns expand infinitely with their periodicity maintained, the diffracted light distribution is a discrete distribution. This holds true as an approximation if the size of a pattern group is sufficiently large. In FIGS. 17A and 17B, higher-order components of the diffracted light are omitted, i.e., not all the diffracted light components are drawn. Of these diffracted light components, only light components passing through the inside of the pupil contribute to image formation.

Upon passing through the pupil, the light components are focused in the polarized state (s-polarized state) shown in FIG. 18A, or in the polarized state (p-polarized state) shown in FIG. 18B. Image formation in the s-polarized state in which electric field vectors are aligned in one direction allows formation of an image with higher contrast than image formation in the p-polarized state. In a general exposure apparatus, it is accepted that the light source 31 is in a nonpolarized state. In this case, nonpolarized light beams can be handled as two linearly polarized light beams which are incoherent and orthogonal to each other. Therefore, in the general exposure apparatus, deterioration in image quality due to p-polarized light components occurs.

The deterioration in image quality due to p-polarized light components can be suppressed by setting a light source in a linearly polarized state and making its direction of polarization coincide with the pattern periodic direction. In this case, however, a deterioration in image quality occurs in patterns having periodicity in different directions on the same reticle. In order to solve this problem, a wavelength plate 40 for rotating the direction of polarization through about 90° at the pupil position is arranged in a region through which different light from patterns in the direction in which a deterioration in image quality is caused by the linearly polarized light passes, as shown in FIG. 19A. With this arrangement, the resolving power can be increased with respect to patterns having periodicity in this direction.

In addition, the use of the wavelength plate leads to the solution to the problem of a light amount loss due to a polarizer arranged at the pupil position in the prior art. If a laser beam is to be used as a light source, and a Brewster window is attached to a laser oscillator, a light amount loss in using linearly polarized light as a light source can be extracted as linearly polarized light. In addition, nonpolarized light such as light emitted from a mercury lamp can also be effectively used by suppressing a light amount loss using a polarization beam splitter 43 and a λ/2 plate 40, as shown in FIG. 20.

Figure 21:
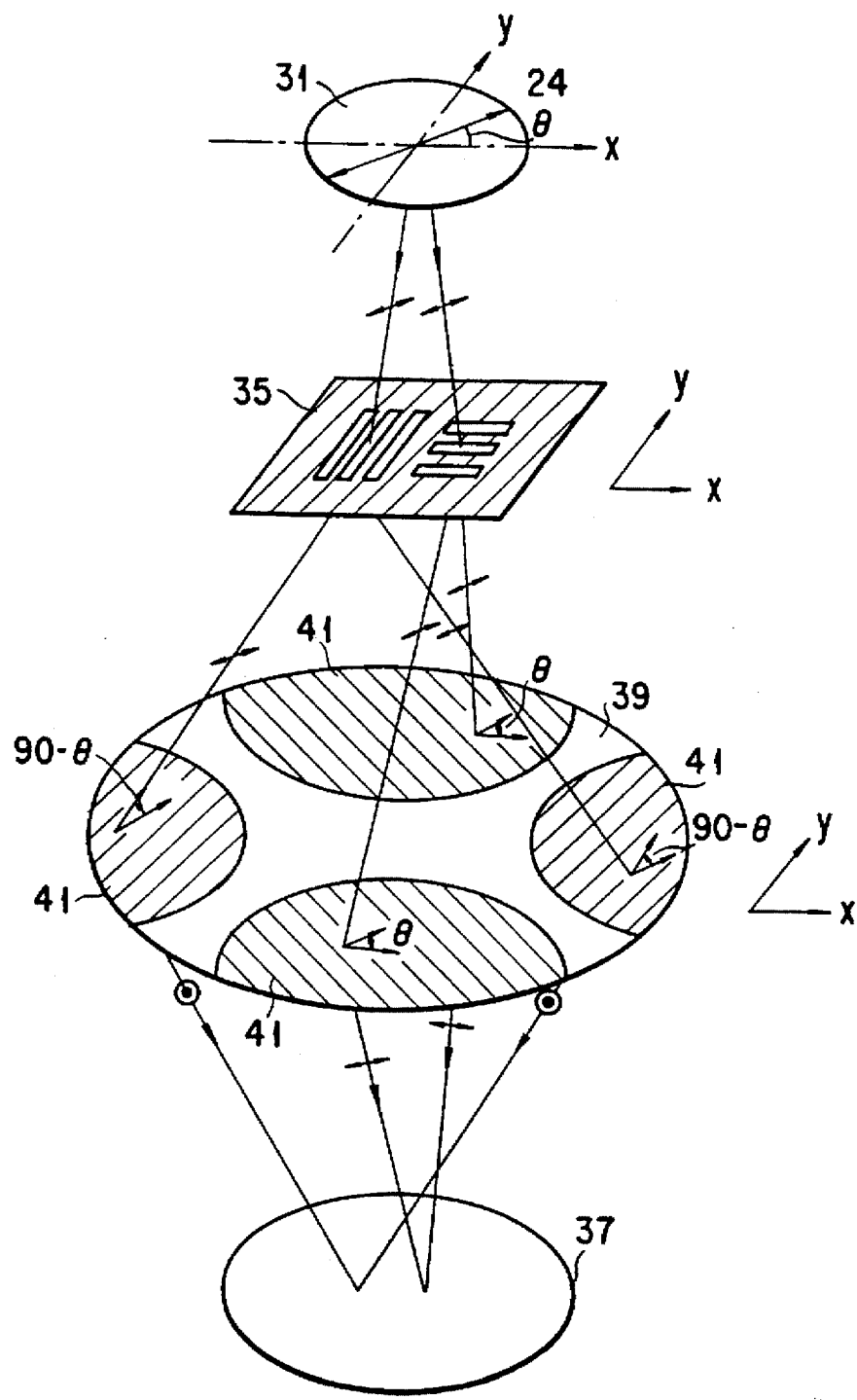
FIG. 21 is a perspective view showing the schematic arrangement of a projection exposure apparatus according to the third embodiment of the present invention.

FIG. 21 is a perspective view showing the schematic arrangement of an exposure apparatus according to the fourth embodiment of the present invention. This embodiment is different from the third embodiment in the inserting position of a wavelength plate at the pupil position, and the rotating direction and rotating angle of a wavelength plate with respect to the linearly direction of polarization. The same reference numerals in FIG. 21 denote the same parts as in FIG. 16, and a detailed description thereof will be omitted.

For the sake of simplicity, assume that in this embodiment, L/S patterns of the mask are arranged in the x and y direction. In this case, the direction of polarization of a light source 31 is set at about 45° with respect to the x and y directions. A wavelength plate 41 shown in FIG. 19B is used to set the rotational angle of the polarization direction at the pupil position to be ±45°, thereby obtaining the same effects as those of the third embodiment. In this case, since all light components equally pass through the wavelength plate regardless of the periodic directions of line-and-space patterns, the influence of a difference in light amount loss, which is caused when light components pass through the wavelength plate 41, on the resolving power can be suppressed.

In the third and fourth embodiments, the polarization characteristic of a light source need not be a linearly polarization characteristic. For example, elliptically polarized light exhibiting a large ratio of major and minor axes may be used. In addition, a light source need not be circular. Even a modified illumination method using a ring-like or four-eye-shaped light source poses no problem as long as a wavelength plate can be arranged at a position on a corresponding pupil. Furthermore, the light intensity distribution need not be a binary distribution, and may continuously change. A light source distribution may be formed by, e.g., an optical fiber bundle.

Even if multiple exposure is performed by modulating the complex transmittance distribution of a pupil plane or changing the focal plane position on the image surface side, no problems are posed in the present invention. In a preferred embodiment, a compensation plate may be formed at the pupil position to compensate for a phase change caused by a wavelength plate. In addition, a wavelength plate having a shape other than that shown in the accompanying drawings may be used without posing any problems. If an alternating phase shift mask is used as a mask, a diffracted light distribution on a pupil plane can be set on a peripheral pupil portion. With this arrangement, the resolving power can be further increased by using polarization characteristics.

According to the second to fourth embodiments described above, a light-shielding plate having opening portions at positions shifted from the optical axis in the X and Y directions is used, and the direction of polarizations of light beams passing through the respective opening portions are defined as linearly direction of polarizations. In addition, the direction of polarizations of light beams from patterns elongated in the X and Y directions of a mask are defined as linearly direction of polarizations. With this arrangement, the resolution limit can be practically increased to λ/2NA. The direction of polarization dependency in interference in image formation can be adjusted regardless of the periodic directions of patterns. Therefore, an improvement in image contrast can be achieved.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An exposure apparatus for projecting a plurality of patterns of a photomask, which are elongated in at least two different directions, onto a substrate through the photomask, comprising:

a polarized light source for illuminating the photomask;

polarization control means for changing a direction of polarization of polarized light from said polarized light source;

a slit filter arranged at a position where the polarized light source is focused, and having a slit through which a polarized light is transmitted, and a longitudinal direction of the slit is at a first angle with respect to a polarization direction of the polarized light;

means for changing the longitudinal direction of said slit in said slit filter in synchronism with a change in polarization direction of the polarized light which is made by said polarization control means; and means for illuminating the photomask with the polarized light wherein a longitudinal direction of the pattern is at a second angle with respect to the polarization direction of the polarized light, thereby exposing a pattern of the photomask onto said substrate.

2. An apparatus according to claim 1, wherein said polarized light source includes a light source and a polarizer, said polarization control means includes means for rotating said polarizer, and said means for changing the longitudinal direction of said slit filter includes means for rotating said slit filter.

3. An apparatus according to claim 1, wherein said polarized light source includes a light source and a polarizer, said polarization control means includes means for switching a plurality of polarizers having different direction of polarizations, and said means for changing the longitudinal direction of said slit filter includes means for switching a plurality of slit filters transmitting polarized light in different directions.

4. An apparatus according to claim 1, wherein said first angle is 90°, and said second angle is 0°.

5. An apparatus according to claim 1, wherein said first angle is 0°, and said second angle is 90°.

6. An apparatus according to claim 1, wherein said photomask is a phase shift mask.

7. An apparatus according to claim 1, wherein said phase shift mask is an alternating phase shift mask.

8. An apparatus according to claim 1, wherein the patterns include first and second patterns respectively elongated in X-axis and Y-axis directions of an X-Y orthogonal coordinate system in a plane perpendicular to an optical axis having the optical axis as an origin.

9. An exposure method of projecting a plurality of patterns of a photomask, which are elongated to at least two different directions, onto a substrate through the photomask, comprising the steps of:

illuminating the photomask by using a polarized light source;

causing a slit filter, arranged at a position wherein polarized light source is focused and having a slit through which polarized light is transmitted and a longitudinal direction of the slit is at a first angle with respect to a polarization direction of the polarized light, to transit polarized light passing through the photomask;

changing the polarization direction of the polarized light; and changing the longitudinal direction of said slit in said slit filter in synchronism with a change in the polarization direction, and illuminating the photomask with the polarized light wherein a longitudinal direction of the pattern is at a second angle with respect to the polarization direction of the polarized light, thereby exposing a pattern of the photomask onto said substrate.

10. A method according to claim 9, wherein the polarization direction of the polarized light is changed by rotating a polarizer, and the longitudinal direction of said slit filter is changed by rotating said slit filter.

11. A method according to claim 9, wherein the polarization direction of the polarized light is changed by switching a plurality of polarizer, and the longitudinal direction of said slit filter is changed by switching a plurality of slit filters.

12. A method according to claim 9, wherein said first angle is 90°, and said second angle is 0°.

13. A method according to claim 9, wherein said first angle is 0°, and said second angle is 90°.

14. An exposure apparatus for illuminating a photomask having first and second patterns respectively elongated in X-axis and Y-axis directions of an X-Y orthogonal coordinate system in a plane perpendicular to an optical axis having the optical axis as an origin, and exposing the patterns onto a substrate by using a projection optical system, comprising:

a light-shielding plate arranged within a plane of an illumination optical system which corresponds to a conjugate plane of a pupil plane of said projection optical system, said light-shielding plate having at least one opening portion;

first polarizing means for defining a polarization plane direction of light incident on the opening portion as polarized light which direction coincides with the X-axis or Y-axis direction; and polarizing members for transmitting only polarized light which has a direction which coincides with the X-axis direction incident on the first pattern, and transmitting only polarized light which has a direction which coincides with the Y-axis direction incident on the second pattern.

15. An apparatus according to claim 14, wherein said light-shielding plate has a pair of opening portions symmetrical about the origin in the X-axis direction, and a pair of opening portions symmetrical about the origin in the Y-axis direction, said first polarizing means includes polarizing members arranged at the respective opening portions of said light-shielding plate, and said second polarizing means includes polarizing members respectively arranged at positions corresponding to the first and second patterns.

16. An apparatus according to claim 14, wherein said light-shielding plate has a pair of opening portions symmetrical about the optical axis in the X-axis or Y-axis direction, said first polarizing means includes polarizing members arranged at the respective opening portions of said light-shielding plate, and said second polarizing means includes polarizing members respectively arranged at positions corresponding to the first and second patterns.

17. An apparatus according to claim 14, wherein said light-shielding plate has an opening portion separated from the origin in the X-axis or Y-axis direction, said first polarizing means includes a polarizing member arranged at the opening portion of said light-shielding plate, and said second polarizing means includes polarizing members respectively arranged at positions corresponding to the first and second patterns.

18. An apparatus according to claim 14, wherein said light-shielding plate has an opening portion at or near the origin, said first polarizing means includes a polarizing member arranged at the opening portion of said light-shielding plate, and said second polarizing means includes polarizing members respectively arranged at positions corresponding to the first and second patterns.

19. An exposure apparatus for illuminating a photomask having first and second patterns respectively elongated in X-axis and Y-axis directions of an X-Y coordinate system having an optical axis as an origin, and exposing the patterns onto a substrate by using a projection optical system, comprising:

a light source which emits illumination light having a polarization direction defined at an angle of $\Theta°$ with respect to the X-axis direction; and first means, arranged on a pupil plane of said projection optical system, for rotating a direction of polarization of the illumination light a radial value $90°-\Theta°$ in first and second regions located on an X-axis and symmetrical about the origin, and second means for rotating the direction of polarization of the illumination light a radial value $\Theta°$ in third and fourth regions located on a Y-axis and symmetrical about the origin, thereby controlling a polarized state to align the direction of polarizations on the pupil plane.

20. An apparatus according to claim 19, wherein said means for controlling the polarized state is a polarizer.

21. An apparatus according to claim 19, wherein said means for controlling the polarized state is a $\lambda/2$ plate.

22. An apparatus according to claim 19, wherein said light source is linearly polarized light.

23. An exposure method for illuminating a photomask having first and second patterns respectively elongated in X-axis and Y-axis directions of an X-Y orthogonal coordinate system in a plane perpendicular to an optical axis having the optical axis as an origin, and exposing the patterns onto a substrate by using a projection optical system, comprising the steps of:

causing a light-shielding plate arranged within a plane of an illumination optical system which corresponds to a conjugate plane of a pupil plane of said projection optical system to transmit a light from a light source, said light-shielding plate having at least one opening portion;

defining a polarization direction of light incident on the opening portion as polarized light which direction coincides with the X-axis or Y-axis direction; and transmitting only polarized light which has a direction which coincides with the X-axis direction incident on the first pattern, and transmitting only polarized light which has a direction which coincides with the Y-axis direction incident on the second pattern.

24. A method according to claim 23, wherein said light-shielding plate has a pair of opening portions symmetrical about the origin in the X-axis direction, and a pair of opening portions symmetrical about the origin in the Y-axis direction, said first polarizing means includes polarizing members arranged at the respective opening portions of said light-shielding plate, and said second polarizing means includes polarizing members respectively arranged at positions corresponding to the first and second patterns.

25. A method according to claim 23, wherein said light-shielding plate has a pair of opening portions symmetrical about the origin in the X-axis or Y-axis direction, said first polarizing means includes polarizing members arranged at the respective opening portions of said light-shielding plate, and said second polarizing means includes polarizing members respectively arranged at positions corresponding to the first and second patterns.

26. A method according to claim 23, wherein said light-shielding plate has an opening portion separated from the optical axis in the X-axis or Y-axis direction, said first polarizing means includes a polarizing member arranged at the opening portion of said light-shielding plate, and said second polarizing means includes polarizing members respectively arranged at positions corresponding to the first and second patterns.

27. A method according to claim 23, wherein said light-shielding plate has an opening portion at or near the origin, said first polarizing means includes a polarizing member arranged at the opening portion of said light-shielding plate, and said second polarizing means includes polarizing members respectively arranged at positions corresponding to the first and second patterns.

* * * * *